(12) United States Patent
Katayama

(10) Patent No.: US 11,087,809 B2
(45) Date of Patent: Aug. 10, 2021

(54) SEMICONDUCTOR MEMORY DEVICE

(71) Applicant: TOSHIBA MEMORY CORPORATION, Tokyo (JP)

(72) Inventor: Akira Katayama, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 51 days.

(21) Appl. No.: 16/565,274

(22) Filed: Sep. 9, 2019

(65) Prior Publication Data
US 2020/0302986 A1 Sep. 24, 2020

(30) Foreign Application Priority Data

Mar. 20, 2019 (JP) .............................. JP2019-052908

(51) Int. Cl.
*G11C 11/16* (2006.01)
(52) U.S. Cl.
CPC ........ *G11C 11/161* (2013.01); *G11C 11/1655* (2013.01); *G11C 11/1657* (2013.01); *G11C 11/1673* (2013.01); *G11C 11/1675* (2013.01)
(58) Field of Classification Search
CPC ..................................................... G11C 11/16
USPC ........................................................ 365/158
See application file for complete search history.

(56) References Cited

U.S. PATENT DOCUMENTS

| | | | |
|---|---|---|---|
| 8,995,207 B2* | 3/2015 | Koob | G11C 5/145 365/189.11 |
| 10,379,746 B2* | 8/2019 | Shirota | G06F 3/0659 |
| 2010/0148288 A1 | 6/2010 | Johnson | |
| 2014/0141530 A1 | 5/2014 | Gaidis et al. | |
| 2014/0245107 A1* | 8/2014 | Thiruvengadam | G11C 13/0004 714/766 |
| 2015/0046644 A1* | 2/2015 | Karp | G11C 19/00 711/109 |
| 2016/0155516 A1* | 6/2016 | Chang | G11C 16/349 714/721 |
| 2016/0267955 A1 | 9/2016 | Iwata | |
| 2017/0162274 A1 | 6/2017 | Moon et al. | |

OTHER PUBLICATIONS

Zhang, et al., "Ring-shaped Racetrack memory based on spin orbit torque driven chiral domain wall motions", Mature, Scientific Reports No. 6 35062, 2016.*
Thomas, et al., "Racetrack Memory: a high-performance, low-cost, non-volatile memory based on magnetic domain vails". International Electron Devices Meeting (IEDM), 2011. 6131603, Dec. 2011.*

(Continued)

*Primary Examiner* — Muna A Techane
(74) *Attorney, Agent, or Firm* — Holtz, Holtz & Volek PC

(57) ABSTRACT

According to one embodiment, a semiconductor memory device comprising: a first memory layer including a plurality of memory units electrically coupled to one another; a first memory area including a first memory unit for data writing of the memory units; a second memory area including a second memory unit for data reading of the memory units; and a controller configured to write data in the first memory unit, shift the data written in the first memory unit to the second memory unit, and read data written in the second memory unit.

20 Claims, 25 Drawing Sheets

(56) References Cited

OTHER PUBLICATIONS

Hayashi, et al., "Current-Controlled Magnetic Domain-Wall Nanowire Shift Register", Science, Apr. 2008, vol. 320.*
Thomas, et al., "Racetrack Memory: a high-performance, low-cost, non-volatile memory based on magnetic domain malls", International Electron Devices Meeting (IEDM), 2011. 6131603, Dec. 2011.
Zhang, et al., "Ring-shaped Racetrack memory based on spin orbit torque driven chiral domain wall motions", Nature, Scientific Reports No. 6 35062, 2016.

* cited by examiner

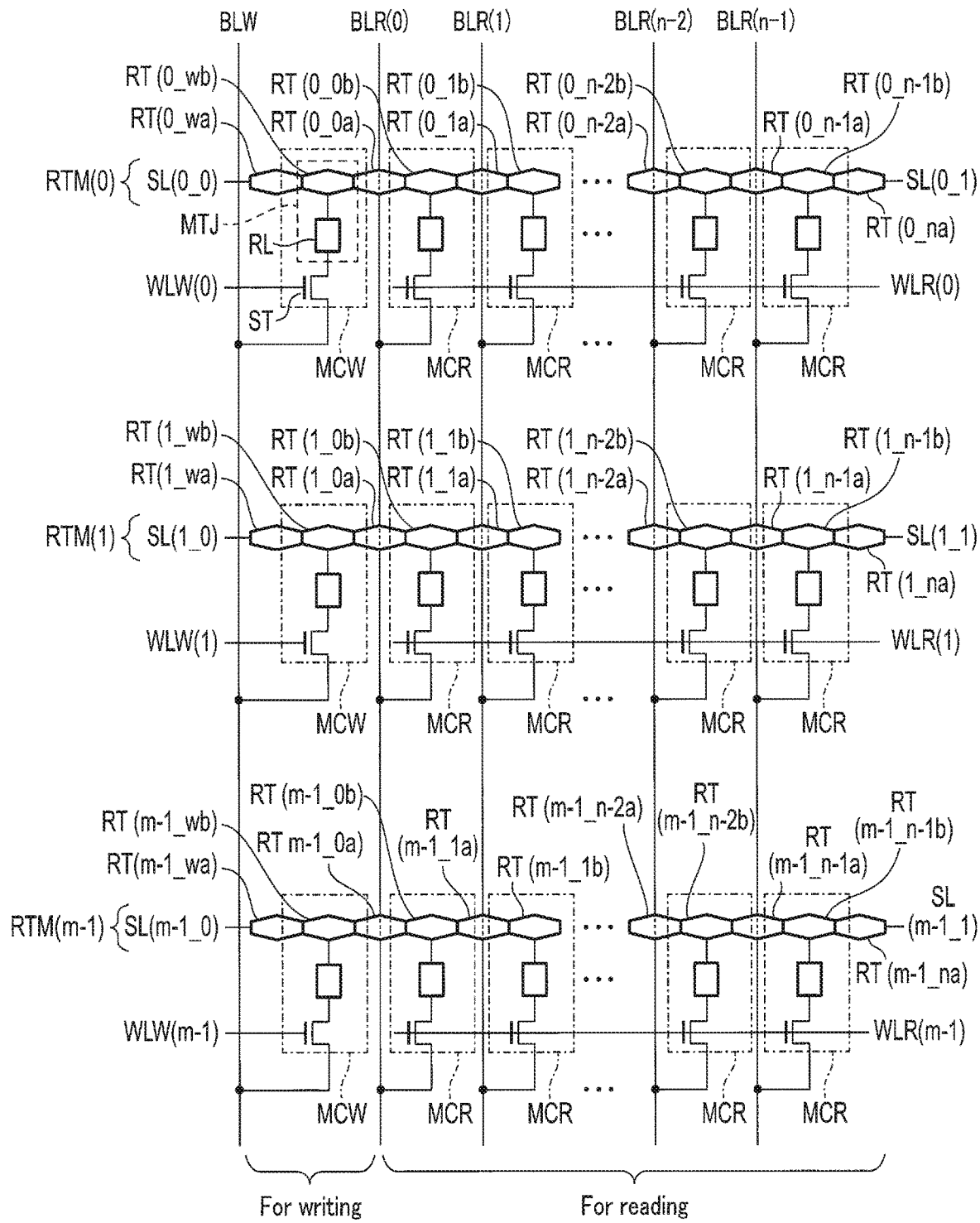
F I G. 3

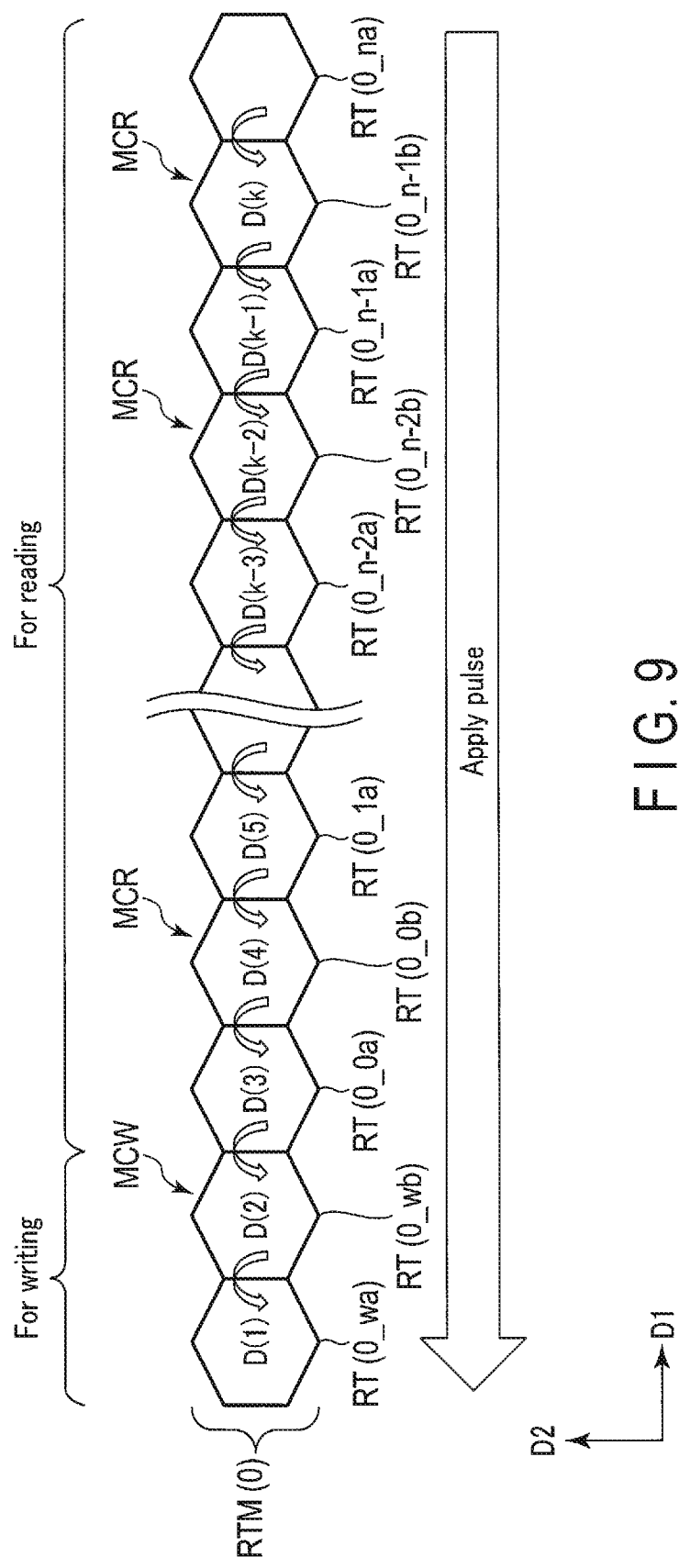
F I G. 9

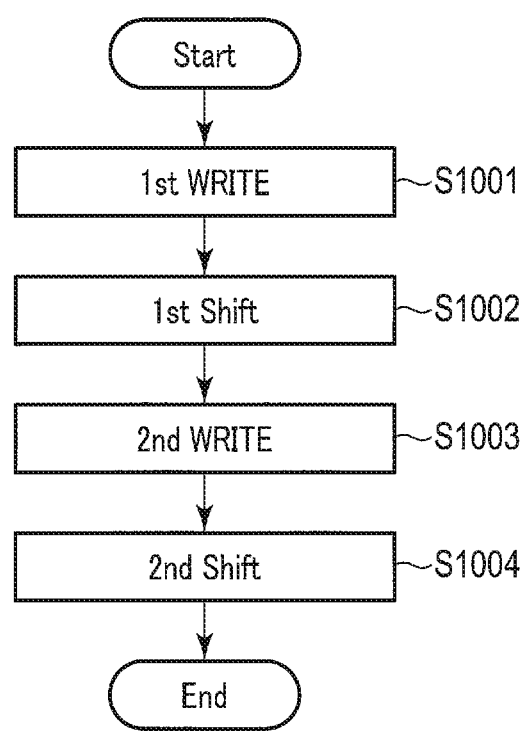
F I G. 10

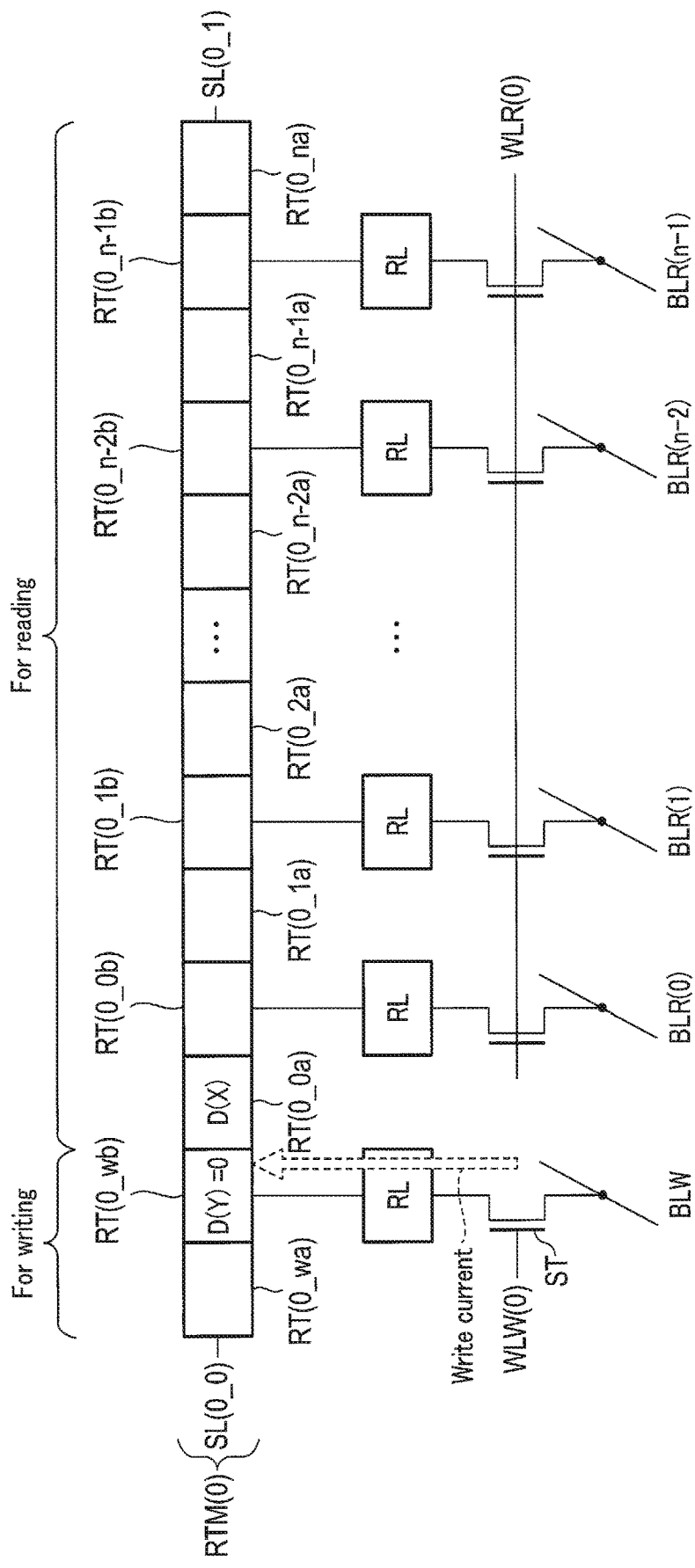
F I G. 13

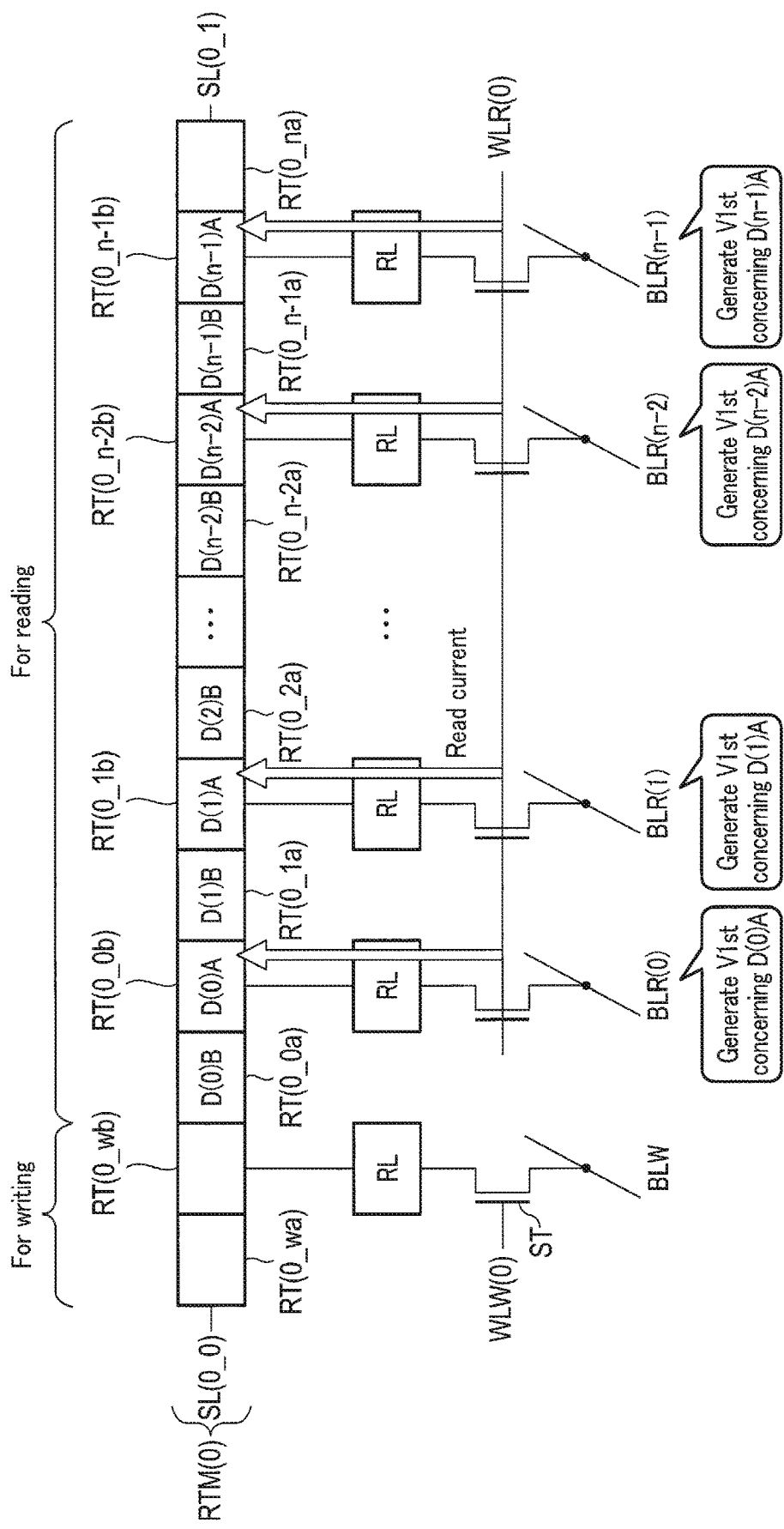
F I G. 17

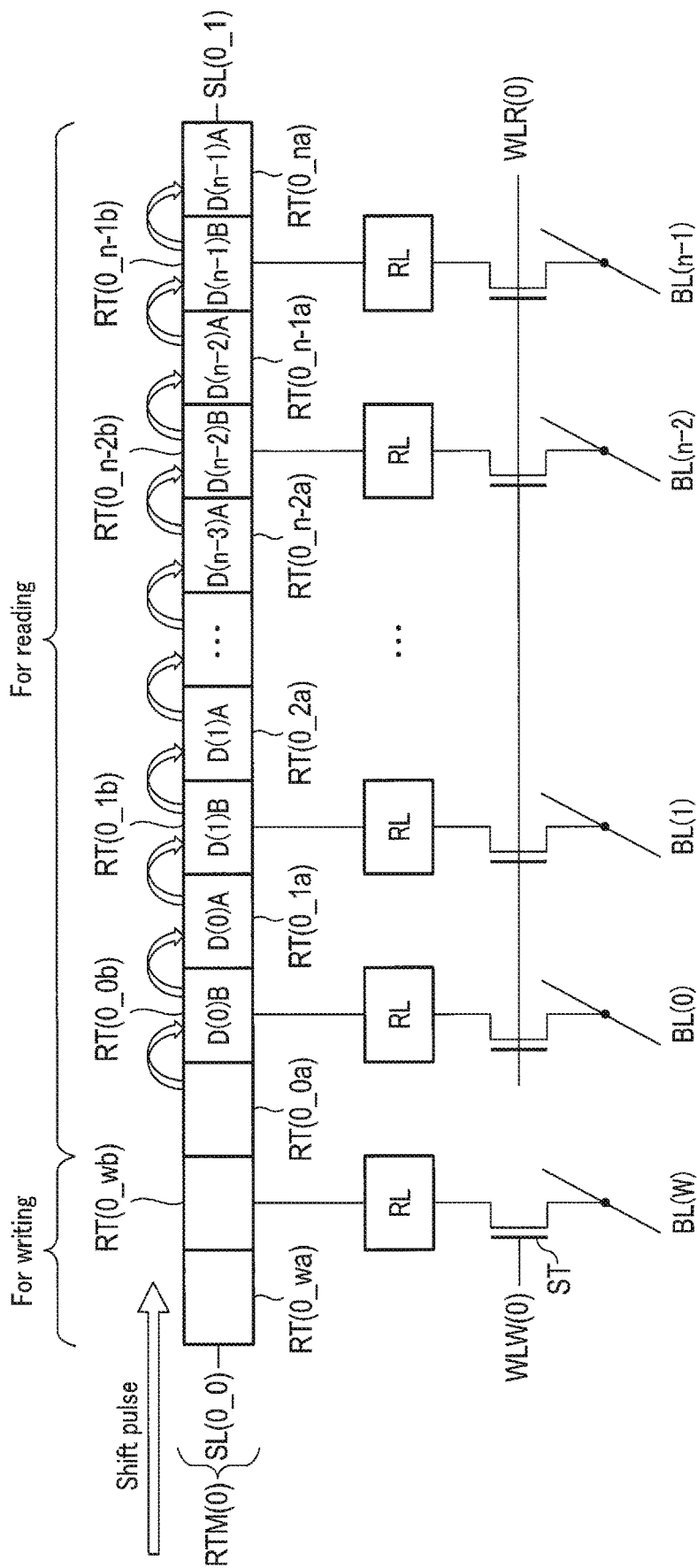
F I G. 18

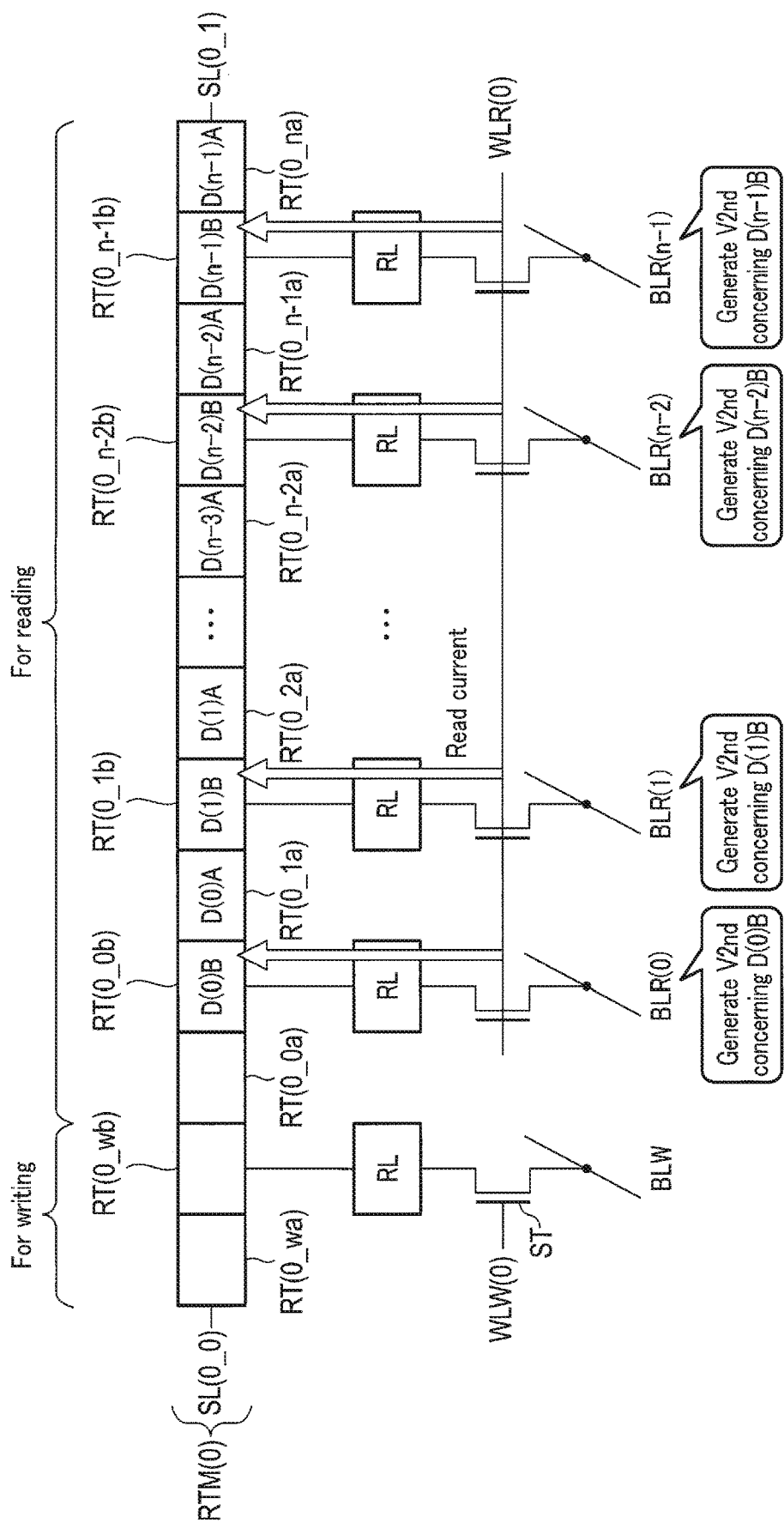
F I G. 19

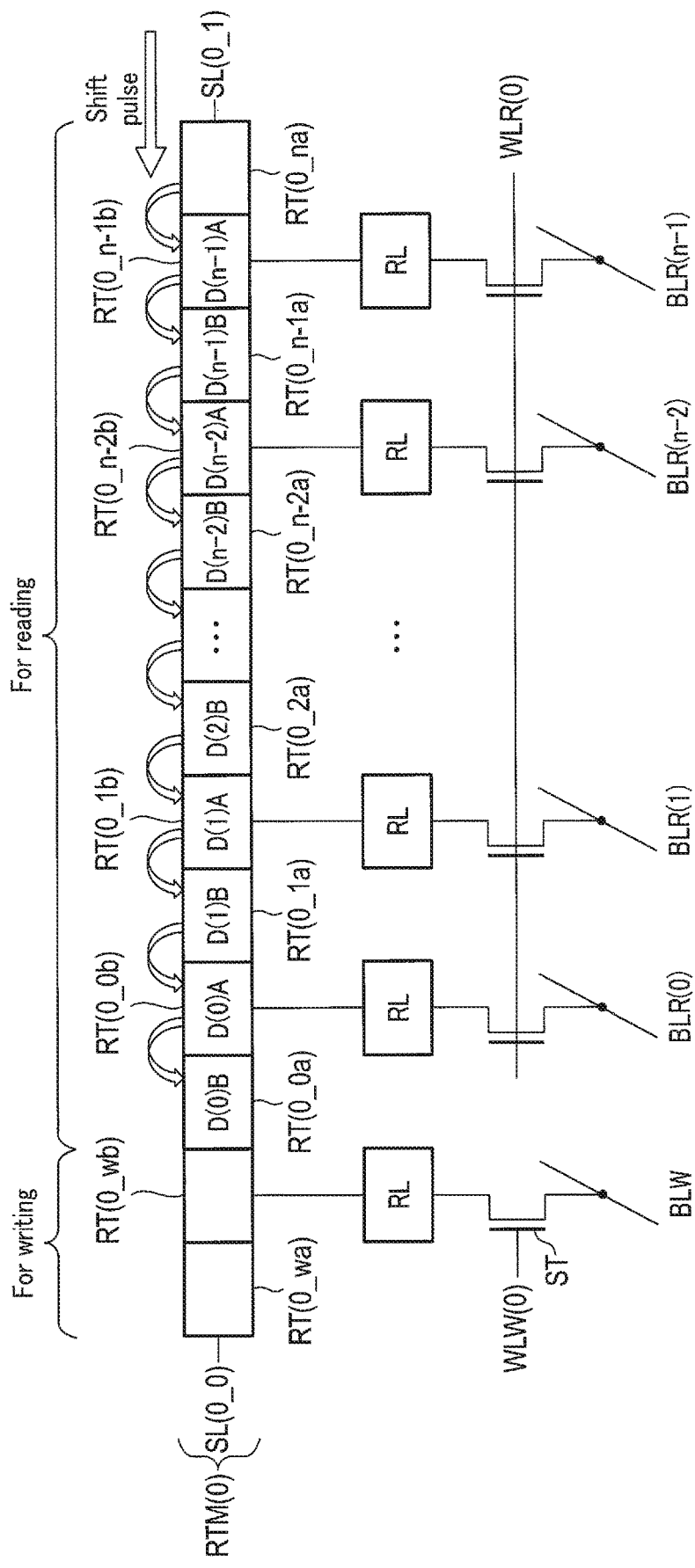
F I G. 20

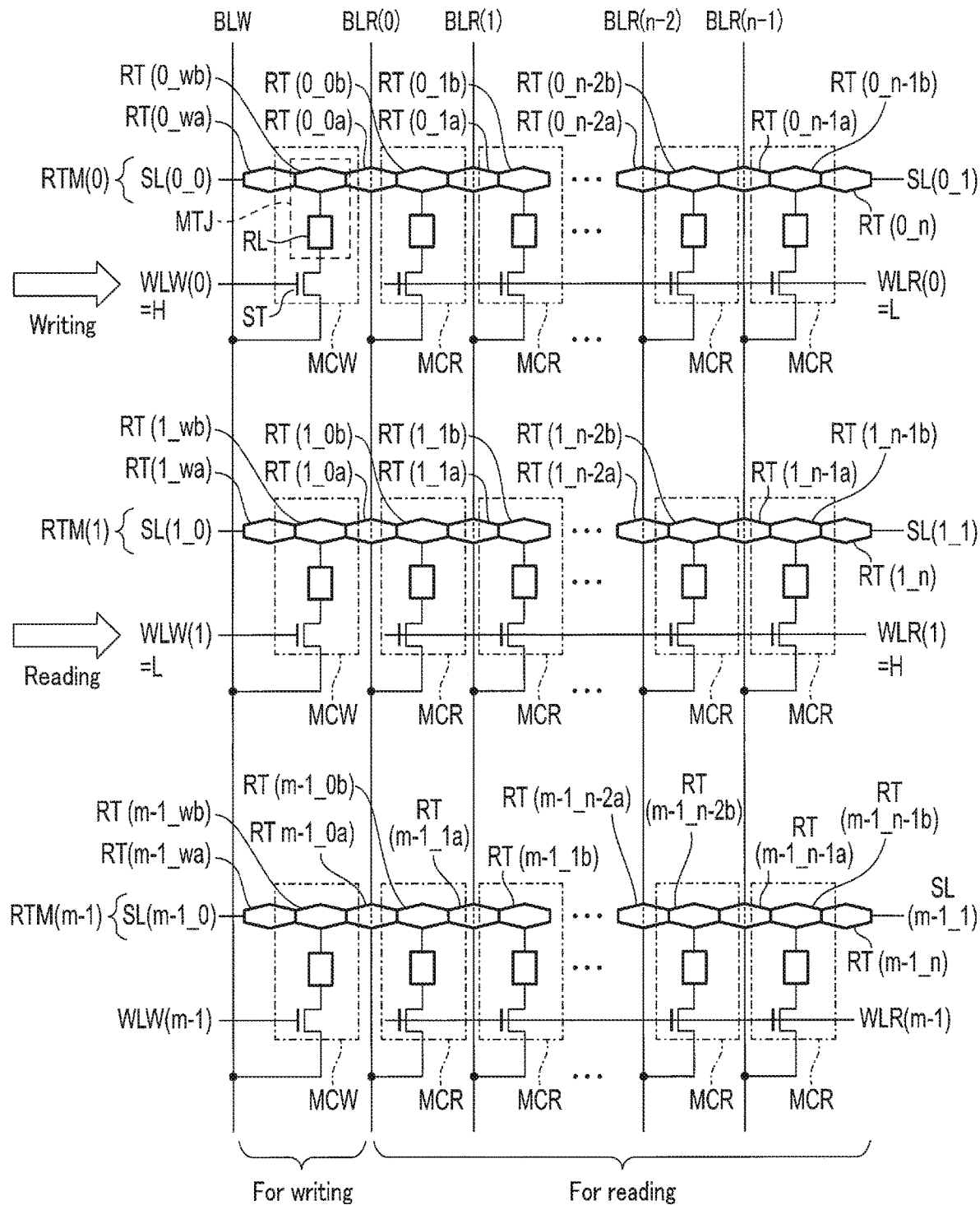
F I G. 21

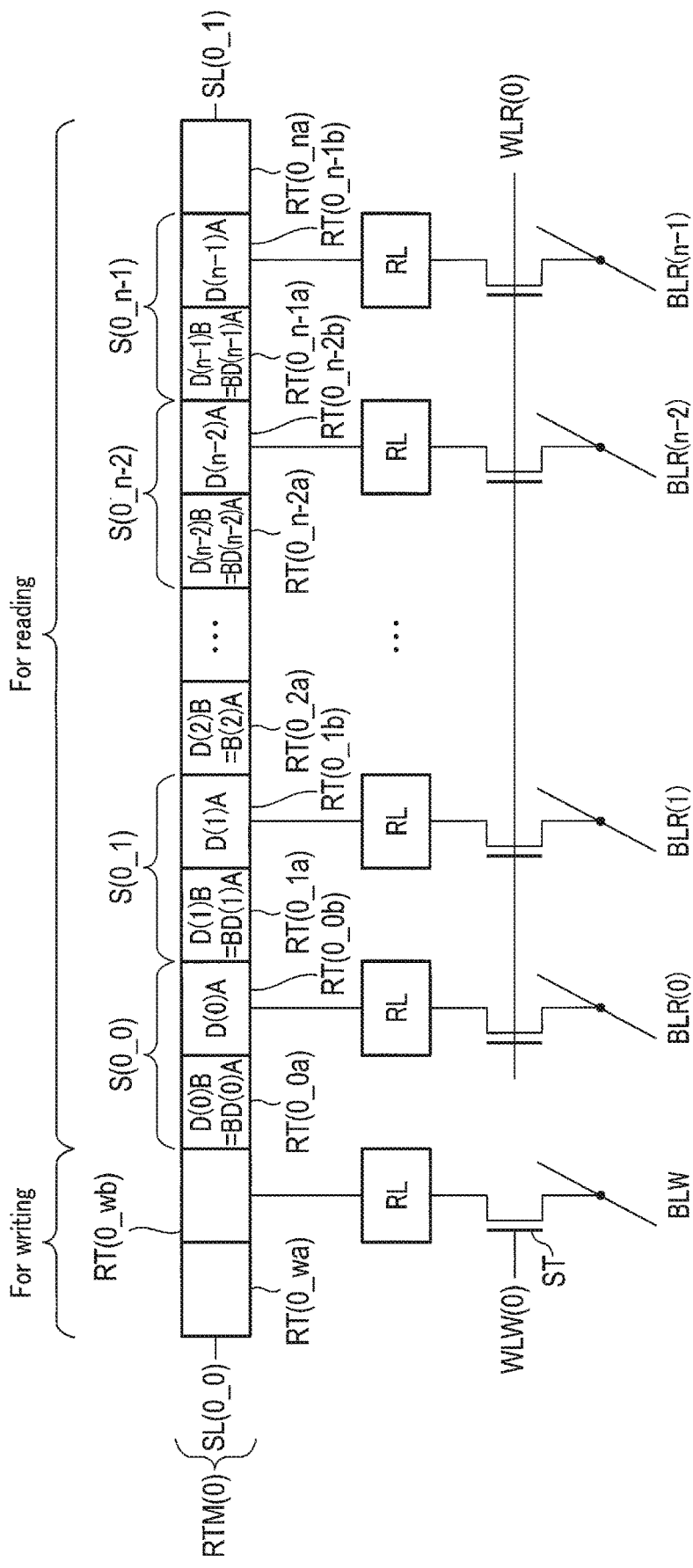
F I G. 22

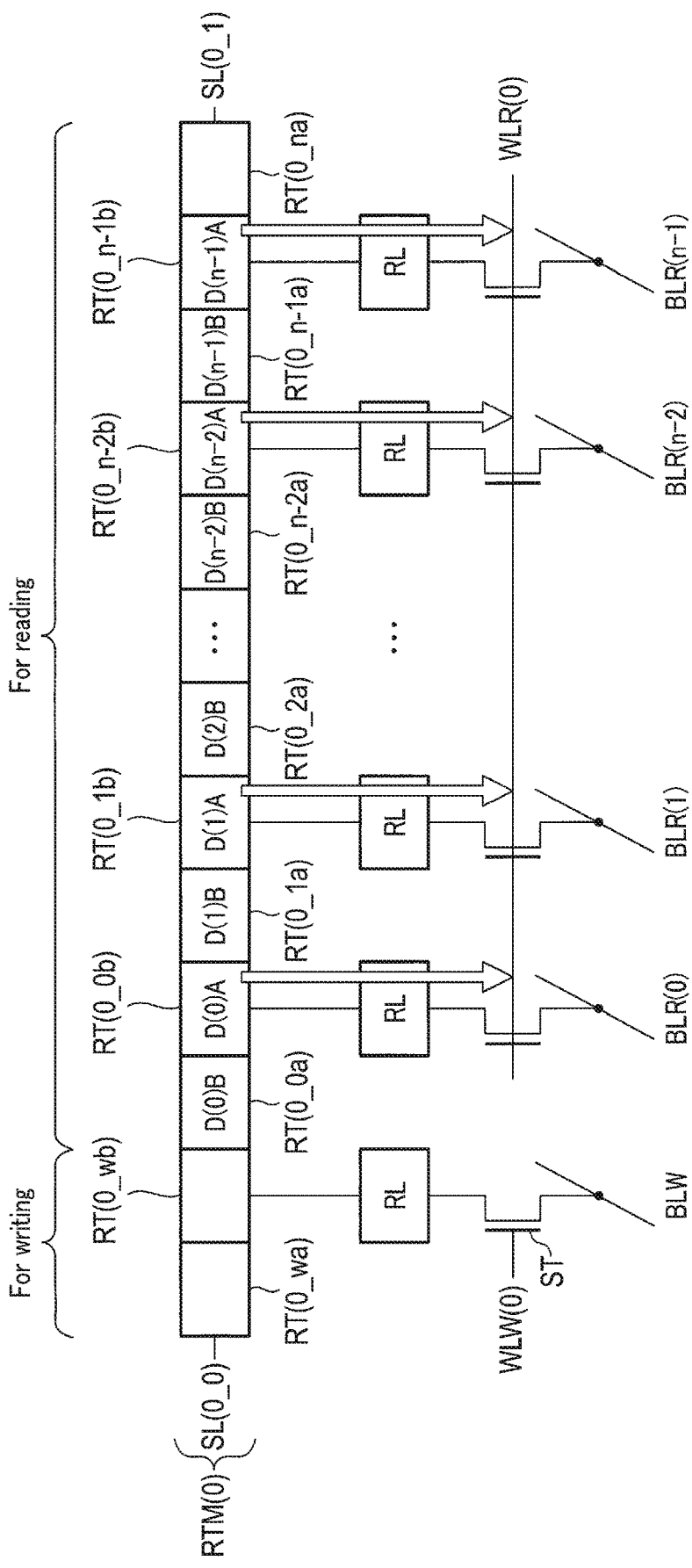
F I G. 23

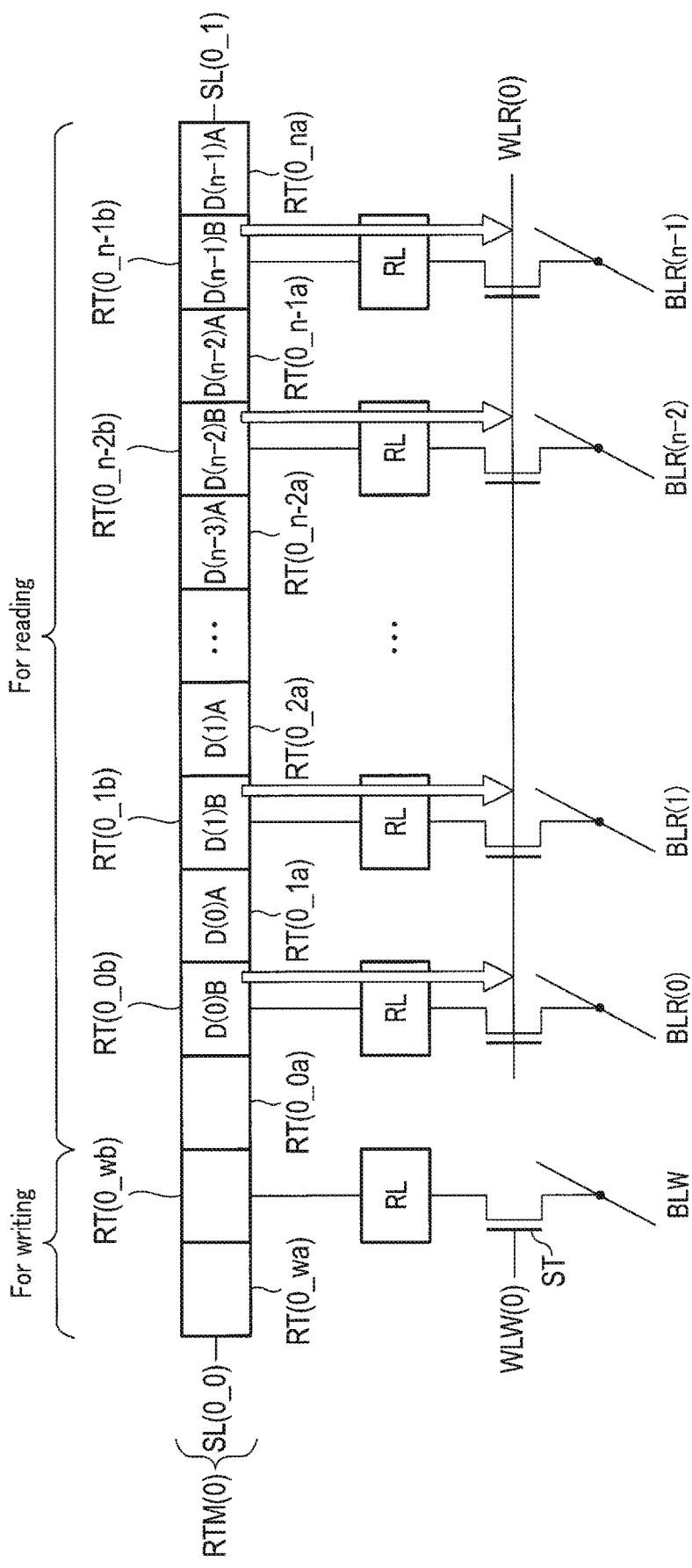
F I G. 24

SEMICONDUCTOR MEMORY DEVICE

CROSS-REFERENCE TO RELATED APPLICATIONS

This application is based upon and claims the benefit of priority from prior Japanese Patent Application No. 2019-052908, filed. Mar. 20, 2019, the entire contents of which are incorporated herein by reference.

FIELD

Embodiments described herein relate generally to a semiconductor memory device.

BACKGROUND

A magnetic random access memory (MRAM) is a memory device employing a magnetic element having a magnetoresistive effect as a memory cell for storing information, and is receiving attention as a next-generation memory device characterized by its high-speed operation, large storage capacity, and nonvolatility. Research and development have been conducted to use the MRAM as a replacement for a volatile memory, such as a DRAM or SRAM. In order to lower development costs and enable smooth replacement, it is desirable to operate the MRAM on the same specifications as the DRAM and SRAM.

BRIEF DESCRIPTION OF THE DRAWINGS

FIG. 3 is a circuit diagram showing a basic configuration of a memory cell array of the semiconductor memory device according to the embodiment.

FIG. 9 is a top view showing a configuration of the domain wall memory of the semiconductor memory device according to the embodiment.

FIG. 10 is a flowchart showing a write operation of the semiconductor memory device according to the embodiment.

FIG. 13 is a block diagram showing the write operation example of the semiconductor memory device according to the embodiment.

FIG. 17 is a block diagram showing the read operation example of the semiconductor memory device according to the embodiment.

FIG. 18 is a block diagram showing the read operation example of the semiconductor memory device according to the embodiment.

FIG. 19 is a block diagram showing the read operation example of the semiconductor memory device according to the embodiment.

FIG. 20 is a block diagram showing the read operation example of the semiconductor memory device according to the embodiment.

FIG. 21 is a circuit diagram showing an effect of the semiconductor memory device according to the embodiment.

FIG. 22 is a block diagram showing a modification of the semiconductor memory device according to the embodiment.

FIG. 23 is a block diagram showing a modification of the semiconductor memory device according to the embodiment.

FIG. 24 is a block diagram showing a modification of the semiconductor memory device according to the embodiment.

DETAILED DESCRIPTION

Figure 1:
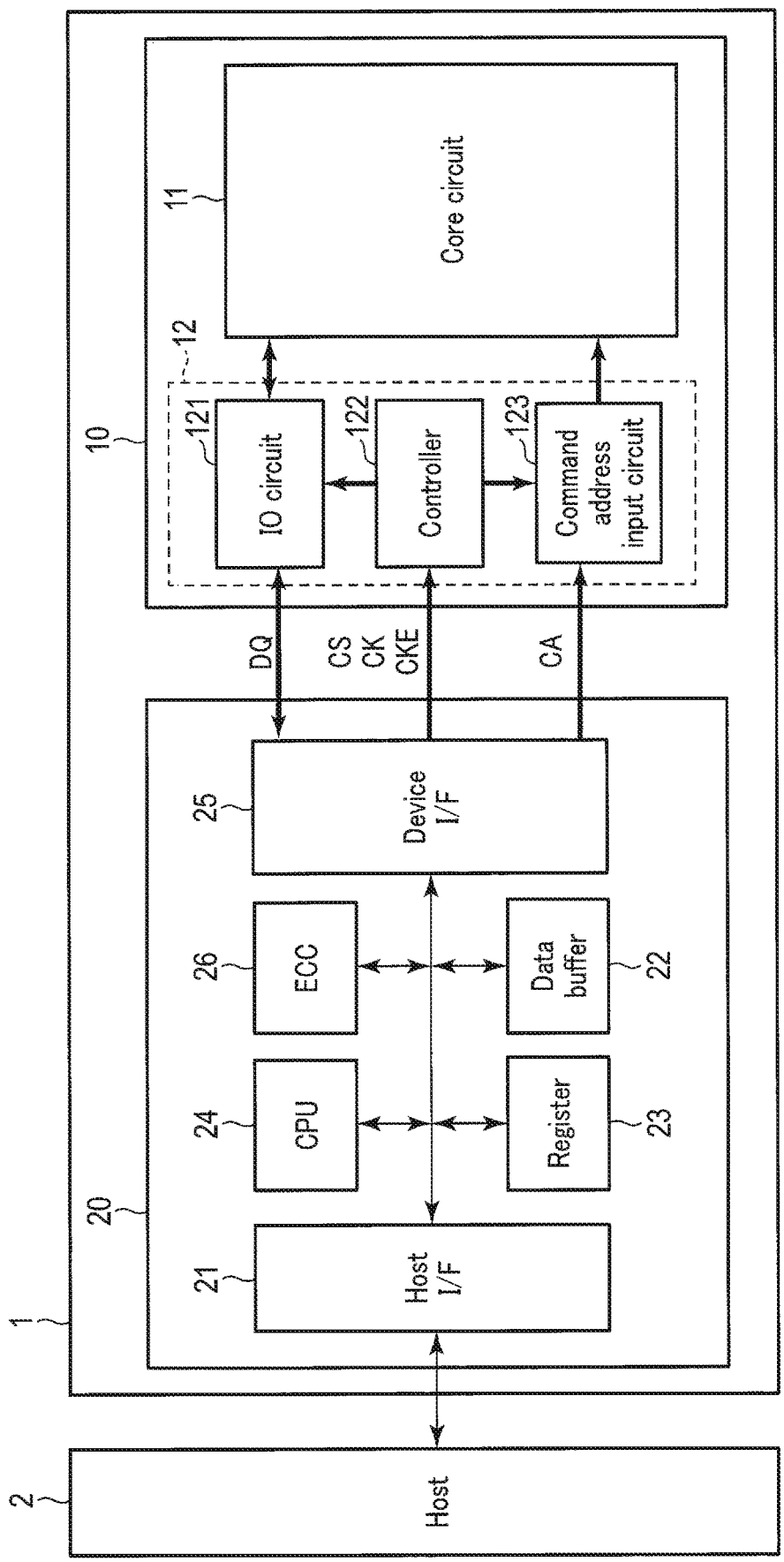
FIG. 1 is a block diagram showing a basic configuration of a memory system including a semiconductor memory device according to an embodiment.

In generally, according to one embodiment, a semiconductor memory device comprising: a first memory layer including a plurality of memory units electrically coupled to one another; a first memory area including a first memory unit for data writing of the memory units; a second memory area including a second memory unit for data reading of the memory units; and a controller configured to write data in the first memory unit, shift the data written in the first memory unit to the second memory unit, and read data written in the second memory unit.

Hereinafter, an embodiment will be described with reference to the drawings. In the following description, structural elements having substantially the same function and configuration will be assigned with the same reference numeral or symbol.

Note that the drawings are schematic and the relationship between thicknesses and planar dimensions, ratio of thicknesses of layers, etc., differ from actual ones. The specific thicknesses and dimensions should be determined with reference to the following description. Needless to say, some ratios and relationships between dimensions differ among drawings.

<1> Embodiment

<1-1> Configuration

<1-1-1> Configuration of Memory System

A basic configuration of a memory system including a semiconductor memory device according to an embodiment will be schematically described with reference to FIG. 1. The memory system 1 includes a semiconductor memory device 10 and a memory controller 20.

<1-1-2> Configuration of Memory Controller

Upon receipt of an instruction from a host (external device) 2, such as a personal computer, the memory controller 20 reads data from or writes data in the semiconductor memory device 10.

The memory controller 20 includes a host interface (I/F) 21, a data buffer 22, a register 23, a CPU 24, a device interface (I/F) 25, and an ECC circuit 26.

The host interface 21 is coupled to the host 2. Data transmission, reception, or the like is performed between the host 2 and the memory system 1 via the host interface 21.

The data buffer 22 is coupled to the host interface 21. The data buffer 22 receives, via the host interface 21, data transmitted from the host 2 to the memory system 1, and temporarily stores the data. The data buffer 22 also temporarily stores data to be transmitted from the memory system 1 to the host 2 via the host interface 21. The data buffer 22 may be either a volatile memory or a nonvolatile memory.

The register 23 is, for example, a volatile memory, and stores information on setting executed by the CPU 24, commands, and statuses, etc. The register 23 may be either a volatile memory or a nonvolatile memory.

The CPU 24 controls the overall operation of the memory system 1. The CPU 24 performs predetermined processing for the semiconductor memory device 10 in accordance with a command received from the host 2, for example.

The device interface 25 performs transmission and reception of various signals or the like between the memory controller 20 and the semiconductor memory device 10.

The ECC circuit 26 receives, via the data buffer 22, write data received from the host 2. The ECC circuit 26 adds an error correcting code to the write data. The ECC circuit 26 supplies the write data, to which the error correcting code has been added, to, for example, the data buffer 22 or the device interface 25.

The ECC circuit 26 also receives, via the device interface 25, data supplied from the semiconductor memory device 10. The ECC circuit 26 determines whether or not the data received from the semiconductor memory device 10 contains an error. When determining that the received data contains an error, the ECC circuit 26 performs error correction processing on the received data by using the error correcting code. Then, the ECC circuit 26 supplies the error-corrected data to the data buffer 22, the device interface 25, etc.

<1-1-3> Semiconductor Memory Device

A basic configuration of the semiconductor memory device according to the embodiment will be schematically described with reference to FIG. 1.

As shown in FIG. 1, the semiconductor memory device 10 according to the embodiment includes a core circuit 11 and a peripheral circuit 12.

The peripheral circuit 12 includes an IO circuit 121, a controller 122, and a command address input circuit 123.

The IO circuit 121 temporarily stores input data input from the memory controller 20 via data line DQ, or output data read from the core circuit 11. The input data is written in a memory cell.

The controller 122 distinguishes between a command and an address. The controller 122 controls the semiconductor memory device 10.

The command address input circuit 123 receives various external control signals, such as a chip select signal CS, a clock signal CK, a clock enable signal CKE, and a command address signal CA, from the memory controller 20. The command address input circuit 123 transfers the command address signal CA to the controller 122.

<1-1-4> Core Circuit

<1-1-4-1> Overview of Core Circuit

A basic configuration of the core circuit 11 of the semiconductor memory device according to the embodiment will be schematically described.

Figure 2:
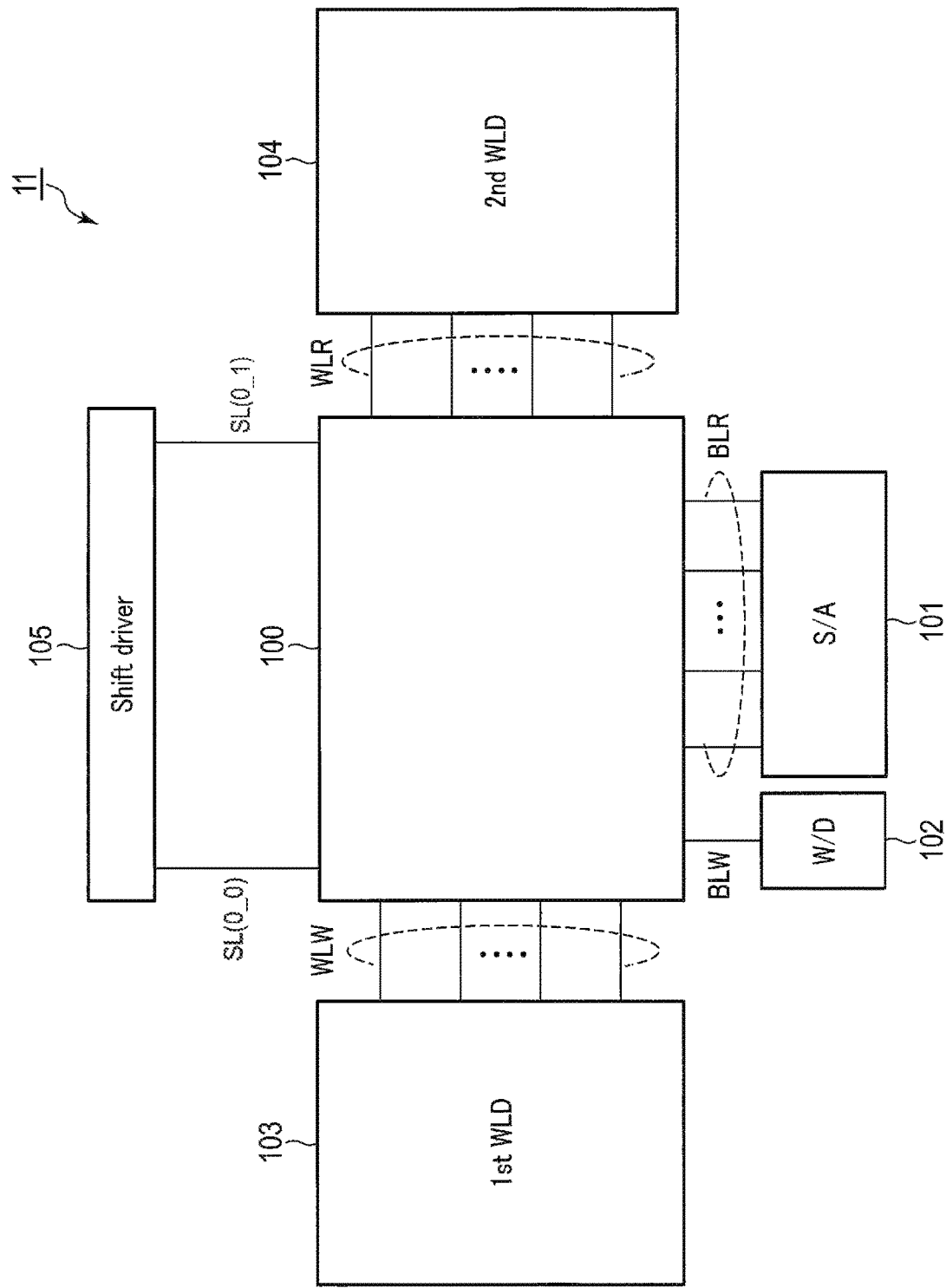
FIG. 2 is a block diagram showing a basic configuration of a core circuit of the semiconductor memory device according to the embodiment.

As shown in FIG. 2, the core circuit 11 includes a memory cell array 100, a sense amplifier (S/A) 101, a write driver (W/D) 102, a first word line driver (1st WLD) 103, a second word line driver (2nd WLD) 104, and a shift driver 105.

<1-1-4-2> Memory Cell Array

<1-1-4-2-1> Overview

Hereinafter, the memory cell array 100, which uses a domain wall memory (memory layer) including a plurality of magnetic domains (memory units) partitioned by domain walls, will be described. As shown in FIG. 3, in the memory cell array 100, a plurality of domain wall memories (memory layers) RTM (RTM(0) to RTM(m−1) in FIG. 3) each extend in the row direction, and a plurality of memory cells MC sharing each domain wall memory RTM are arranged in the column direction.

The domain wall memory RTM includes a plurality of magnetic domains RT partitioned by domain walls. The two magnetic domains RT at the ends of the domain wall memory RTM are coupled to different source lines SL. The two magnetic domains RT (RT(0_wa) to RT (m−1_wa) and RT(0_na) to RT(m−1_na)) at the ends of each domain wall memory RTM are used as redundant areas.

Each memory cell MC includes a magnetoresistive effect element (magnetic tunnel junction (MTJ) element) constituted by a magnetic domain RT and a reference layer RL, and a select transistor ST.

A memory cell MC is provided for every other magnetic domain RT.

There are roughly two types of memory cells MC. One is a write memory cell MCW, and the other is a read memory cell MCR.

<1-1-4-2-2> Write Memory Cell

Write memory cells MCW are arranged along a write bit line BLW.

One end of the select transistor ST of each write memory cell MCW is coupled to one end of the MTJ element, and the other end of the select transistor ST is coupled to the write bit line BLW.

The gate of the select transistor ST of the write memory cell MCW is coupled to a write word line WLW (WLW(0) to WLW(m−1)), and receives a control signal from the first word line driver 103.

The write memory cell MCW is not coupled to the sense amplifier 101, Therefore, in the present semiconductor memory device 10, data cannot be directly read from the write memory cell MCW.

<1-1-4-2-3> Read Memory Cell

Next, the read memory cell MCR will be described. Read memory cells MCR are arranged along read bit lines BLR (BLR(0) to BLR(n−1)), There are a plurality of read bit lines BLR. Therefore, read memory cells MCR are arranged in a plurality of columns.

One end of the select transistor ST of each read memory cell MCR is coupled to one end of the MTJ element, and the other end of the select transistor ST is coupled to a read bit line BLR.

The gate of the select transistor ST of the read memory cell MCR is coupled to a read word line WLR (WLR(0) to WLR(m−1)), and receives a control signal from the second word line driver 104. The read word lines each extend in the row direction, and are each coupled to the gates of a plurality of select transistors ST aligned in the same row.

The read memory cell MCR is not coupled to the write driver 102. Therefore, in the present semiconductor memory device 10, data cannot be directly written in the read memory cell MCR.

As described above, data is written in the write memory cell MCW. Data written by the write driver 102 and the shift driver 105 in a magnetic domain RT corresponding to a write memory cell MCW is shifted (moved) to a magnetic domain RT corresponding to a read memory cell MCR. This shift will be described later. In this way, data is shifted to a magnetic domain corresponding to a read memory cell MCR, and is made readable.

The write word line WLW is not electrically coupled to the read word line WLR. This enables simultaneous execution of a write operation and a read operation in different domain wall memories RM, details of which will be described later.

In the present embodiment, the number of bits of data read at once is larger than the number of bits of data written at once.

When the write word line WLW and the read word line WLR are not distinguished from each other, they are merely referred to as a "word line WL". Similarly, when the write bit line BLW and the read bit line BLR are not distinguished from each other, they are merely referred to as a "bit line BL".

<1-1-4-2-4> Memory Cell

Next, a configuration of the memory cell MC of the semiconductor memory device according to the embodiment will be schematically described with reference to FIG. 4. For easier understanding, one of a plurality of magnetic domains RT will be described.

Figure 4:
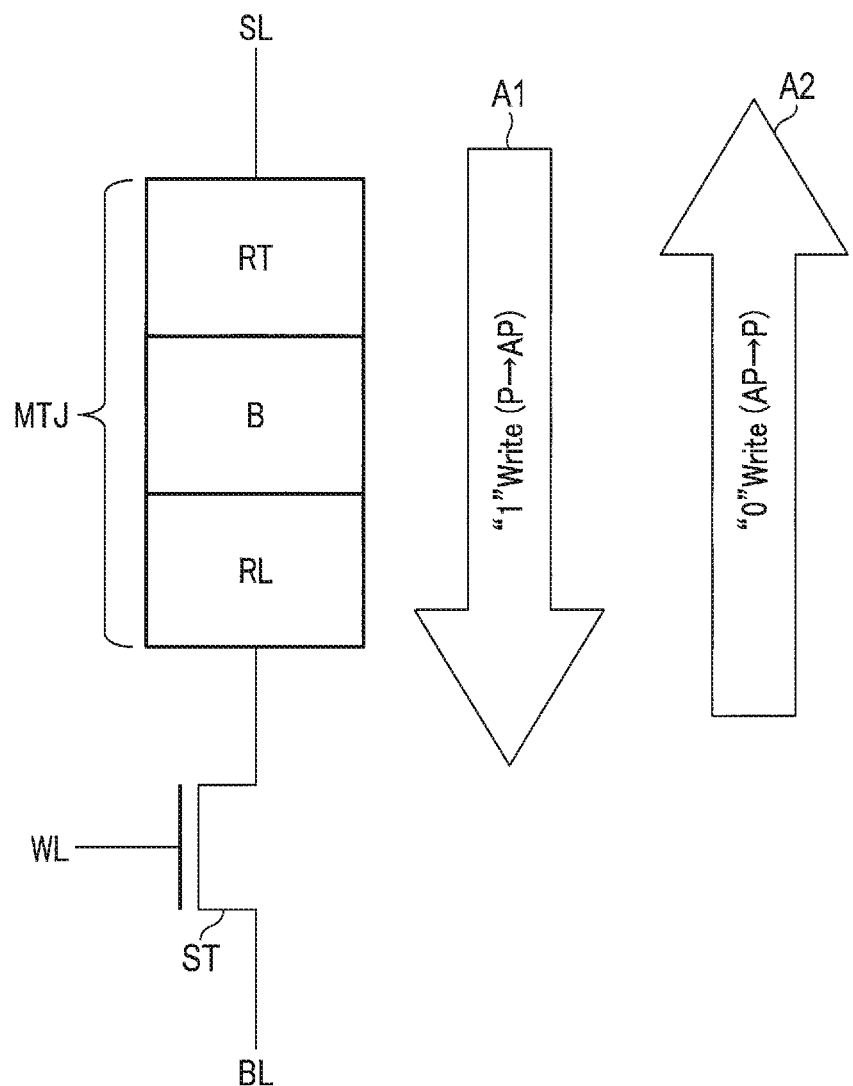
FIG. 4 is a diagram showing a basic configuration of a memory cell of the semiconductor memory device according to the embodiment.

As shown in FIG. 4, the memory cell MC includes an MTJ element and a select transistor. One end (magnetic domain RT) of the MTJ element is coupled to a source line SL, and the other end (reference layer RL) thereof is coupled to one end of the select transistor ST. The other end of the select transistor ST is coupled to a bit line EL. The select transistor ST is turned on or off in accordance with the potential of the word line WL coupled to its gate.

The MTJ element has a laminated structure constituted by two ferromagnetic layers (a magnetic domain RT and a reference layer RL) and a non-magnetic layer (tunnel insulating film) B interposed therebetween. The MTJ element stores digital data by utilizing changes in the magnetic resistance caused by a tunneling magnetoresistive effect (TMR). The MTJ element may take a low-resistance state or a high-resistance state in accordance with the magnetization directions of the two ferromagnetic layers (magnetic domain RT and reference layer RL). For example, when the low-resistance state is defined as data "0", and the high-resistance state is defined as data "1", 1-bit data can be stored in the MTJ element. Needless to say, the low-resistance state may be defined as data "1", and the high-resistance state may be defined as data "0".

For example, the MTJ element is formed by sequentially stacking a reference layer (pin layer, fixed layer) RL, a non-magnetic layer B, and a magnetic domain RT which functions as the memory layer (free layer). The reference layer RL and magnetic domain RT are each constituted by a ferromagnetic body, and the non-magnetic layer B is constituted by an insulating film (such as $Al_2O_3$ or MgO). The reference layer RL has a fixed magnetization direction, while the magnetic domain RT has a variable magnetization direction and stores data in accordance with the magnetization direction.

When a current flows in the direction of arrow A1 in a write operation, the magnetization direction of the magnetic domain RT becomes anti-parallel (AP state) to the magnetization direction of the reference layer RL. As a result, the MTJ element takes the high-resistance state (data "1"). When a current flows in the direction of arrow A2 in a write operation, the magnetization direction of the magnetic domain RT becomes parallel (P state) to the magnetization direction of the reference layer RL. As a result, the MTJ element takes the low-resistance state (data "0"). In this manner, different data can be written in the MTJ element depending on the direction in which a current flows. The expression "the magnetization direction is variable" used above means that the magnetization direction changes in response to a predetermined write current. The expression "the magnetization direction is fixed" means that the magnetization direction does not change in response to a predetermined write current.

<1-1-4-2-5> Arrangement of Domain Wall Memory and Memory Cells

Next, a specific arrangement of memory cells aligned in the row direction will be described with reference to FIGS. 5 and 6.

Figure 5:
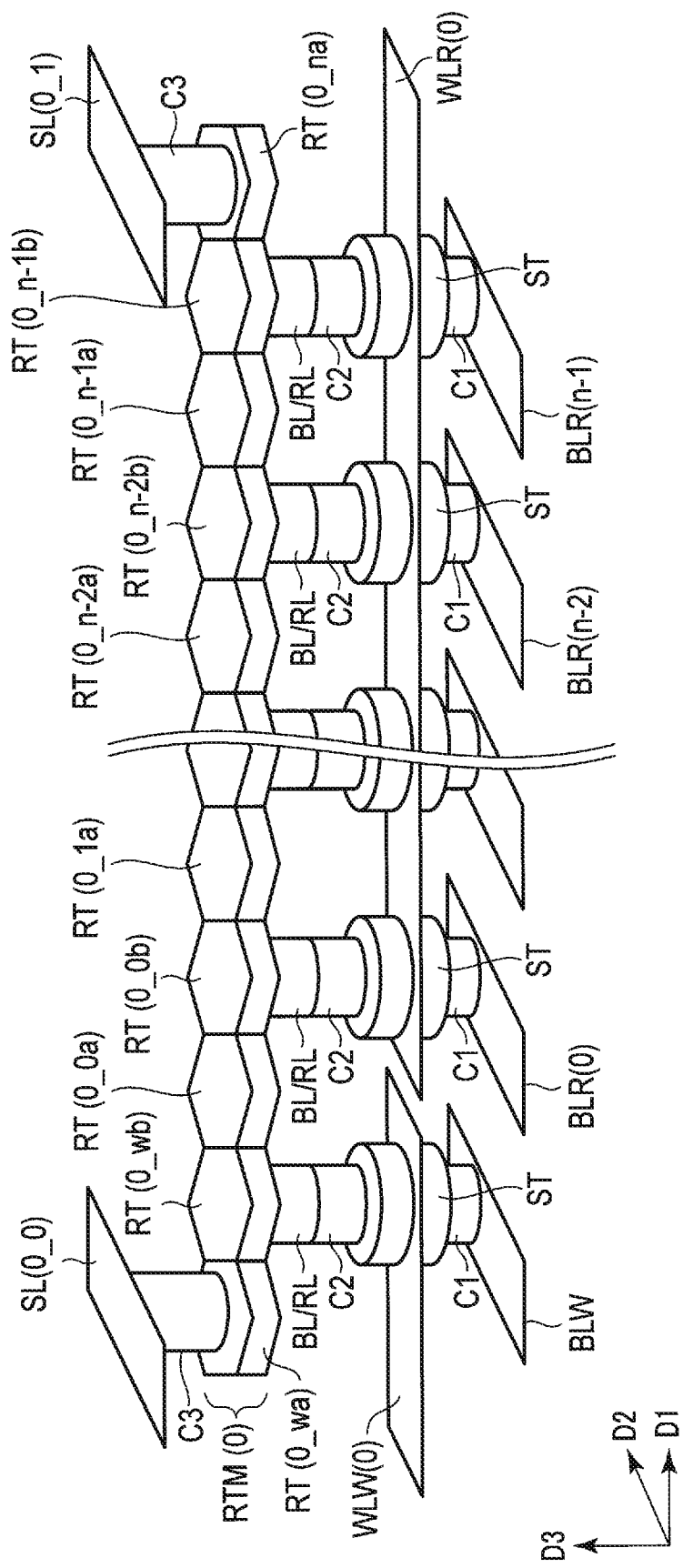
FIG. 5 is a perspective view showing a row-direction configuration of the memory cell array of the semiconductor memory device according to the embodiment.
Figure 6:
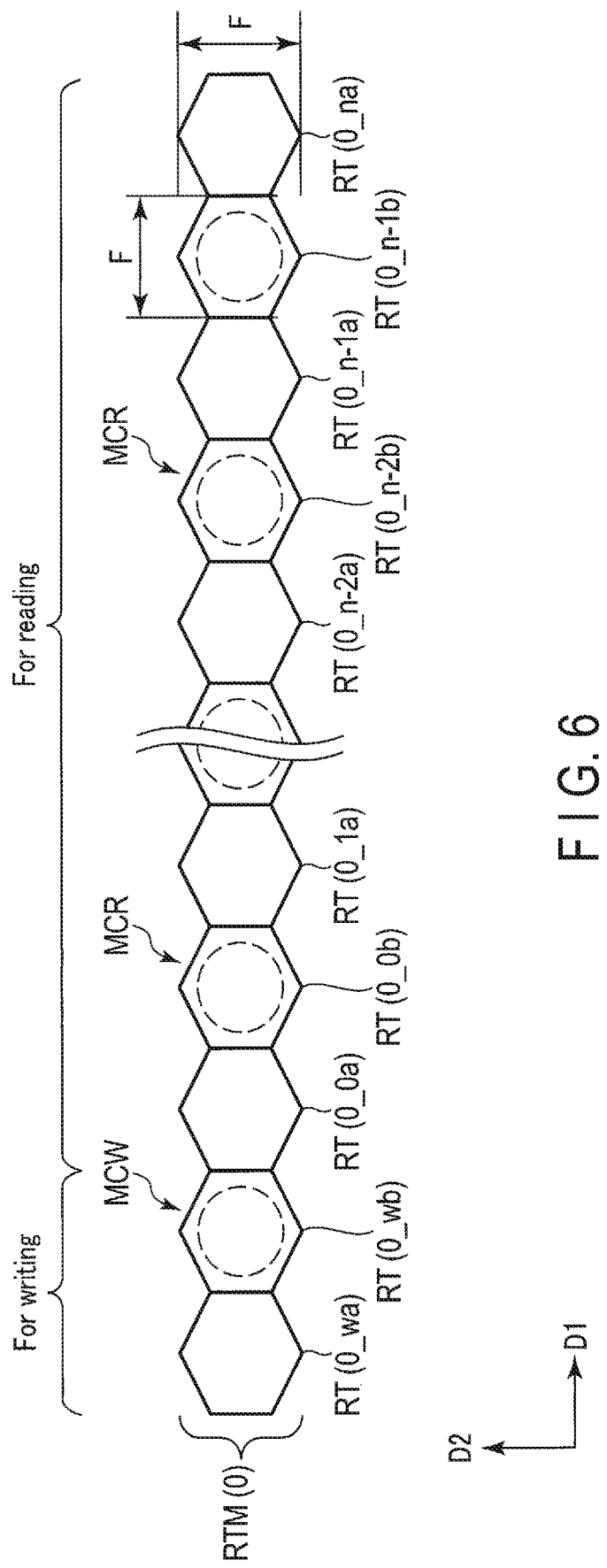
FIG. 6 is a top view showing a configuration of a domain wall memory of the semiconductor memory device according to the embodiment.

In FIGS. 5 and 6, the row direction is labeled as D1, the column direction is labeled as D2, and the direction perpendicular the substrate of the semiconductor memory device 10 is labeled as D3. D1 to D3 are orthogonal to one another.

With reference to FIGS. 5 and 6, descriptions will be provided while focusing on one domain wall memory RTM (0).

As shown in FIG. 5, a bit line BL, a contact C1, select transistor ST, a contact C2, a non-magnetic layer B and a reference layer RL, a domain wall memory RTM, a contact C3, and a source line SL are sequentially stacked in the D3 direction.

Specifically, a plurality of bit lines EL (BLW and BLR(0) to BLR(n−1)) each made of a conductive material extend in the D2 direction. A columnar contact C1 made of a conductive material is provided on each bit line BL. A columnar select transistor ST is provided on the contact C1. A word line WL (WLW(0) or WLR(0)), which functions as the gate electrode of the selection transistor ST, covers part of the side surface of the select transistor ST. The word line WL is made of a conductive material. A columnar contact C2 made of a conductive material, etc. is provided on the select transistor ST. A columnar non-magnetic layer B and reference layer RL are provided on the contact C2. A domain wall memory RTM(0), which extends in the D1 direction, is provided on the columnar non-magnetic layer B and reference layer RL. The domain wall memory RTM(0) is provided in such a manner that the columnar non-magnetic layer B and reference layer RL are positioned in correspondence with every other magnetic domain RT. A contact C3 made of a conductive material is provided on each of the magnetic domains RT (RT(0_wa) and RT(0_na)) at the ends of the domain wall memory RTM. A source line SL (SL(00), SL(01)) made of a conductive material is provided on the contact C3.

<1-1-4-2-6> Domain Wall Memory RTM

As shown in FIGS. 5 and 6, the domain wall memory RTM is a ferromagnetic body extending in the D1 direction. The width (F) of each magnetic domain in the domain wall memory RTM in the D1 direction is, for example, substantially the same as that in the D2 direction. Shown in the figures is the case where each magnetic domain RT is hexagonal; however, the magnetic domain RT may have another shape. In the present embodiment, the domain wall memory RTM is shown as being divided into a plurality of magnetic domains RT in the figures for easier understanding. However, the magnetic domains RT are electrically coupled to one another.

Figure 7:
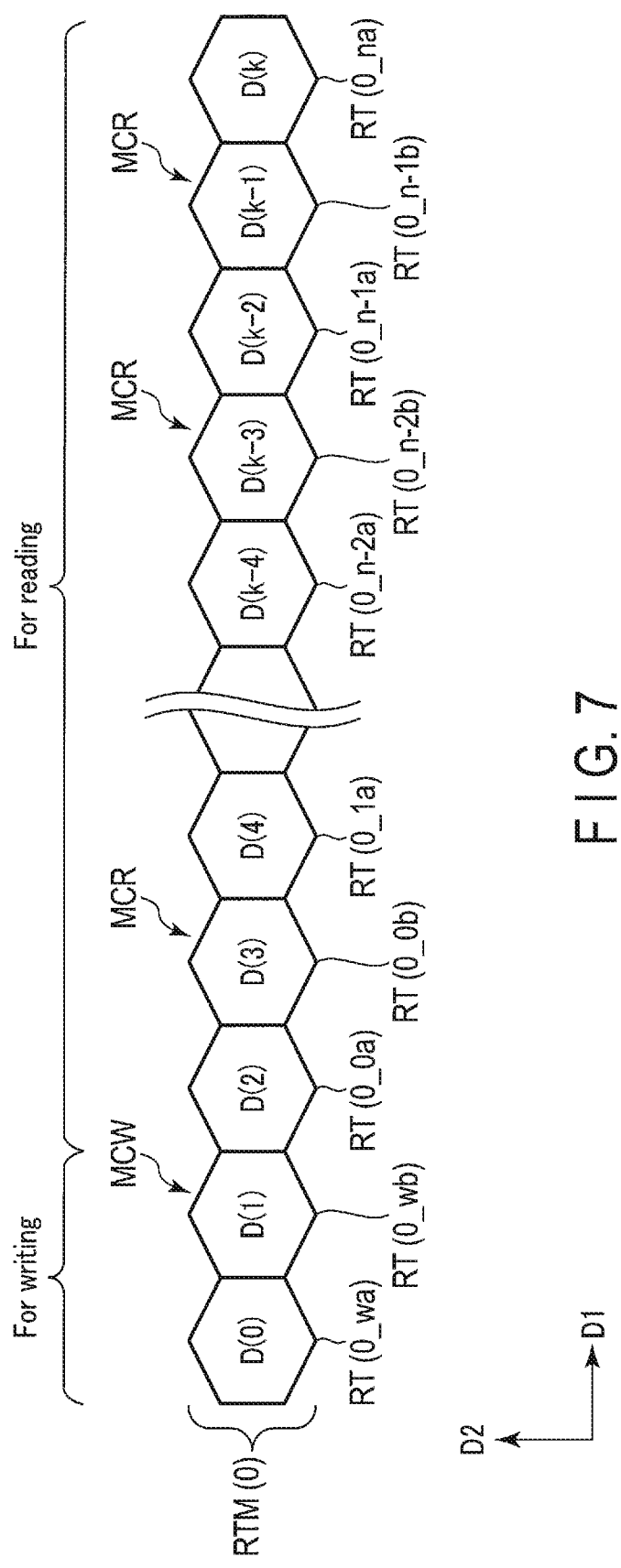
FIG. 7 is a top view showing a configuration of the domain wall memory of the semiconductor memory device according to the embodiment.

As shown in FIG. 7, each magnetic domain RT has a variable magnetization direction. Therefore, the magnetic domains RT store respective data (D(0) to D(k)).

When a predetermined pulse (shift pulse) is applied to an end of the domain wall memory RTM, magnetization reversal (domain wall displacement reversal) is performed in a magnetic domain forming domain wall displacement mode in which magnetization reversal is sequentially performed in magnetic domains. In the magnetic domain forming domain wall displacement mode, a domain wall formed between magnetic domains with different magnetization directions moves as magnetization reversal of magnetic domains advances.

Figure 8:
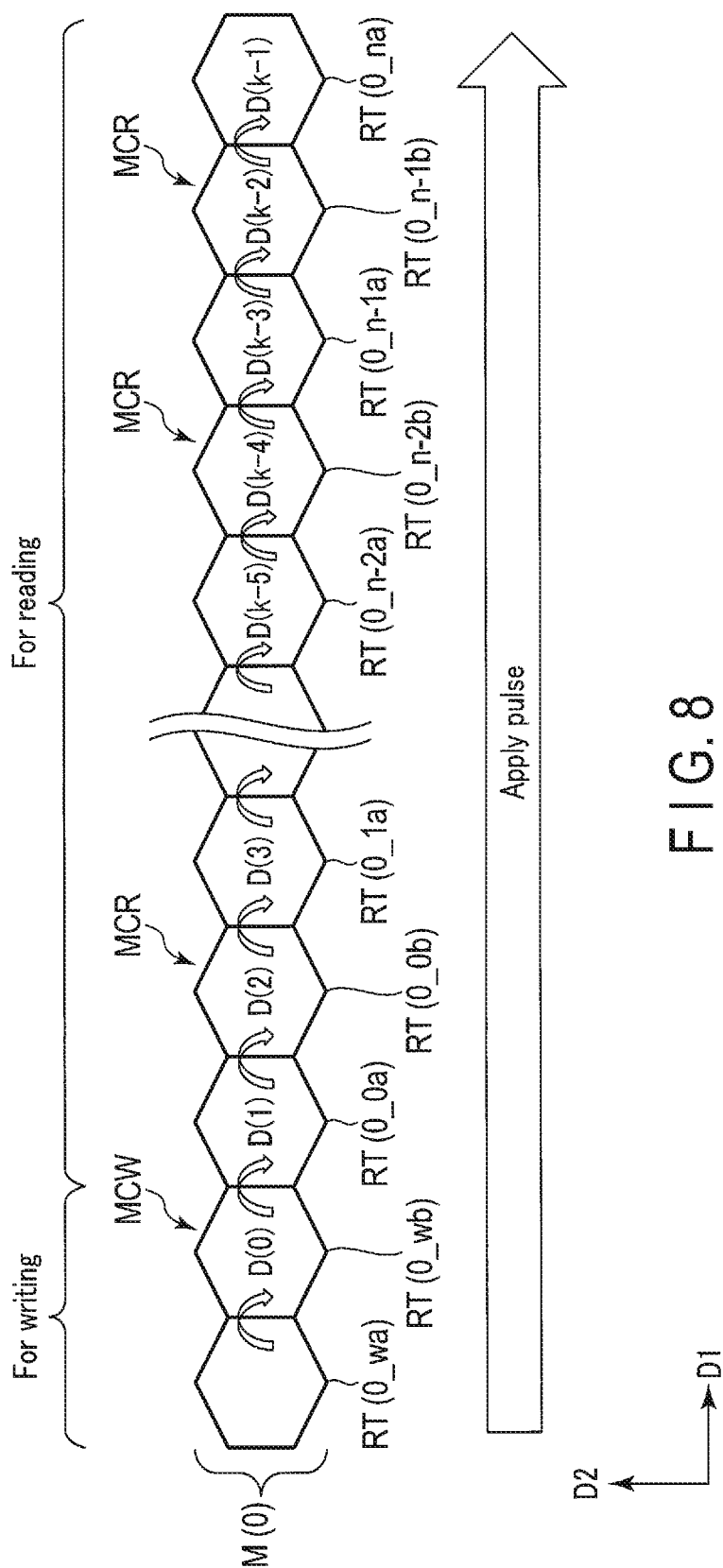
FIG. 8 is a top view showing a configuration of the domain wall memory of the semiconductor memory device according to the embodiment.

Specifically, as shown in FIG. 8, when a given pulse is applied to magnetic domain RT(0_wa) via the source line SL, all data is shifted by one magnetic domain RT from magnetic domain RT(0_wa) to magnetic domain RT(0_na).

Similarly, as shown in FIG. 9, when a shift pulse is applied to magnetic domain. RT(0_na) via the source line SL, all data is shifted by one magnetic domain RT from magnetic domain RT(0_na) to magnetic domain RT(0_wa).

<1-1-4-3> Core Circuit Except for Memory Cell Array

Referring back to FIG. 2, the remaining part of the core circuit 11 will be described.

The sense amplifier 101 and shift driver 105 are used when data is read from a memory cell MC. Specifically, the sense amplifier 101 detects a current that flows through a read memory cell MCR by passing a current to the read memory cell MCR via a read bit line BLR. Data can be determined based on the detected current. In this case, the shift driver 105 passes the current that has flown through the sense amplifier 101, read bit line BLR, memory cell MCR, and source line SL to the ground.

The shift driver 105 may pass a current to the memory cell MCR via a source line SL. The sense amplifier 101 may thereby detect a current that flows through the memory cell MCR and determine data. In this case, the sense amplifier 101 passes the current that has flown through the shift driver 105, source line SL, memory cell MCR, and read bit line BLR to the ground.

The write driver 102 and shift driver 105 are used when data is written in a memory cell MC. Specifically, the write driver 102 writes data in a write memory cell MCW by passing a current to the write memory cell MCW via a write bit line BLW. In this case, the shift driver 105 passes the current that has flown through the write driver 102, write bit line BLW, memory cell MC, and source line SL to the ground.

The shift driver 105 and the write driver 102 may also write data in a write memory cell MCW by having the shift driver 105 pass a current to the write memory cell MCW via a source line SL. In this case, the write driver 102 passes the current that has flown through the shift driver 105, source line SL, memory cell MC, and write bit line BLW to the ground.

The first word line driver 103 controls selection of a write memory cell MCW. Specifically, the first word line driver 103 controls ON (in conduction) and OFF (out of conduction) of the select transistor ST of a write memory cell MCW via a write word line WLW.

The second word line driver 104 controls selection of a read memory cell MCR. Specifically, the second word line driver 104 controls ON and OFF of the select transistor ST of a read memory cell MCR via a read word line WLR.

In the domain wall memory RTM, data moves between magnetic domains RT in response to application of a pulse. Therefore, the shift driver 105 is configured to not only perform the above-described operations, but also apply a shift pulse to an end of the domain wall memory RTM via a source line SL.

<1-2> Operation

As described above, the MTJ element of the semiconductor memory device according to the embodiment stores data by using a change in the resistance value. When reading information stored in such an MTJ element, the semiconductor memory device passes a read current (also referred to as a cell current) through the MTJ element. Then, the semiconductor memory device converts the resistance value of the MTJ element into a current value or voltage value, and compares it with a reference value, thereby determining the resistance state.

However, as variation between the resistances of the MTJ elements increases, the margin between the resistance value distributions of the "0" state and the "1" state may decrease. Therefore, the read margin extremely decreases in a reading method in which a reference value is set between resistance value distributions, and the state of each MTJ element is determined based on the result of comparison with the reference value.

To deal with the situation, the embodiment employs a reference signal obtained by adding offset signal information to signal information (current value or voltage value) of one resistance state of the "0" state and "1" state of each MTJ element. Then, the initial state of the MTJ element is determined based on the reference signal. Such a self-reference reading method will be described.

When the self-reference reading method is performed in the semiconductor memory device of the present embodiment, it is necessary to write in advance data (also referred to as objective data, etc.) according to a write instruction in a magnetic domain relating to a memory cell, and determination data for determining the objective data in an adjacent magnetic domain.

Next, a write operation of the semiconductor memory device according to the embodiment will be described.

<1-2-1> Overview of Write Operation

<1-2-1-1> Overview

An overview of the write operation of the semiconductor memory device according to the embodiment will be described with reference to FIG. 10.

[Step S1001]

First, the controller 122 writes objective data. Specifically, upon receipt of a write instruction (host command) from the host 2, the memory controller 20 issues an active command and a write command to the semiconductor memory device 10.

Upon receipt of an active command and a write command from the memory controller 20, the semiconductor memory device 10 applies an H-level voltage to the write word line WLW coupled to the select transistor ST of a write target memory cell MCW. The select transistor is thereby turned on (brought into conduction), and a current flows through the memory cell MCW. Then, the semiconductor memory device 10 supplies a current to the memory cell MCW via the write bit line BLW or source line SL to perform a first write operation. Accordingly, the semiconductor memory device 10 can write data in the magnetic domain RT of the memory cell MCW. The data written in step S1001 is data corresponding to the write instruction (also referred to as objective data, etc.).

[Step S1002]

Next, the controller 122 controls the shift driver 105 to shift data of the domain wall memory RTM to write determination data. Specifically, the semiconductor memory device 10 applies a shift pulse to the end (magnetic domain) of the domain wall memory RTM close to the write memory cell MCW via the source line SL. Data of the domain wall memory RTM is thereby shifted by one magnetic domain RT. This is an operation to write determination data for determining objective data in a magnetic domain adjacent to the magnetic domain storing the objective data.

[Step S1003]

Next, the controller 122 writes determination data. Specifically, after step S1002, the semiconductor memory device 10 applies an H-level voltage to the write word line WLW coupled to the select transistor of the write target memory cell MCW. The select transistor is thereby turned on (brought into conduction), and a current flows through the memory cell MCW. The semiconductor memory device 10 performs a second write operation to write first data (such as a "0" write operation (WRITE "0")) on the memory cell MCW.

When data is written in the memory cell MCW as described above, first data (here, "0" data) needs to be written in a magnetic domain adjacent to the magnetic domain storing objective data. The reason why two types of data need to be written will be described later.

[Step S1004]

Subsequently, the controller 122 controls the shift driver 105 to shift data of the domain wall memory RTM so that written data can be read from a read memory cell MCR. Specifically, the semiconductor memory device 10 applies a pulse to the end of the domain wall memory RTM close to the write memory cell MCW via the source line SL. Data of the domain wall memory RTM is thereby shifted by one magnetic domain. Accordingly, data written in the write memory cell MCW is supplied to a read memory cell MCR.

As described above, two magnetic domains are used in a set in the present embodiment.

<1-2-1-2> Specific Example

A specific example of the write operation of the semiconductor memory device according to the embodiment will be described with reference to FIGS. 11 to 14. As an example, the case where data is written in domain wall memory RTM(0) will be described.

Figure 11:
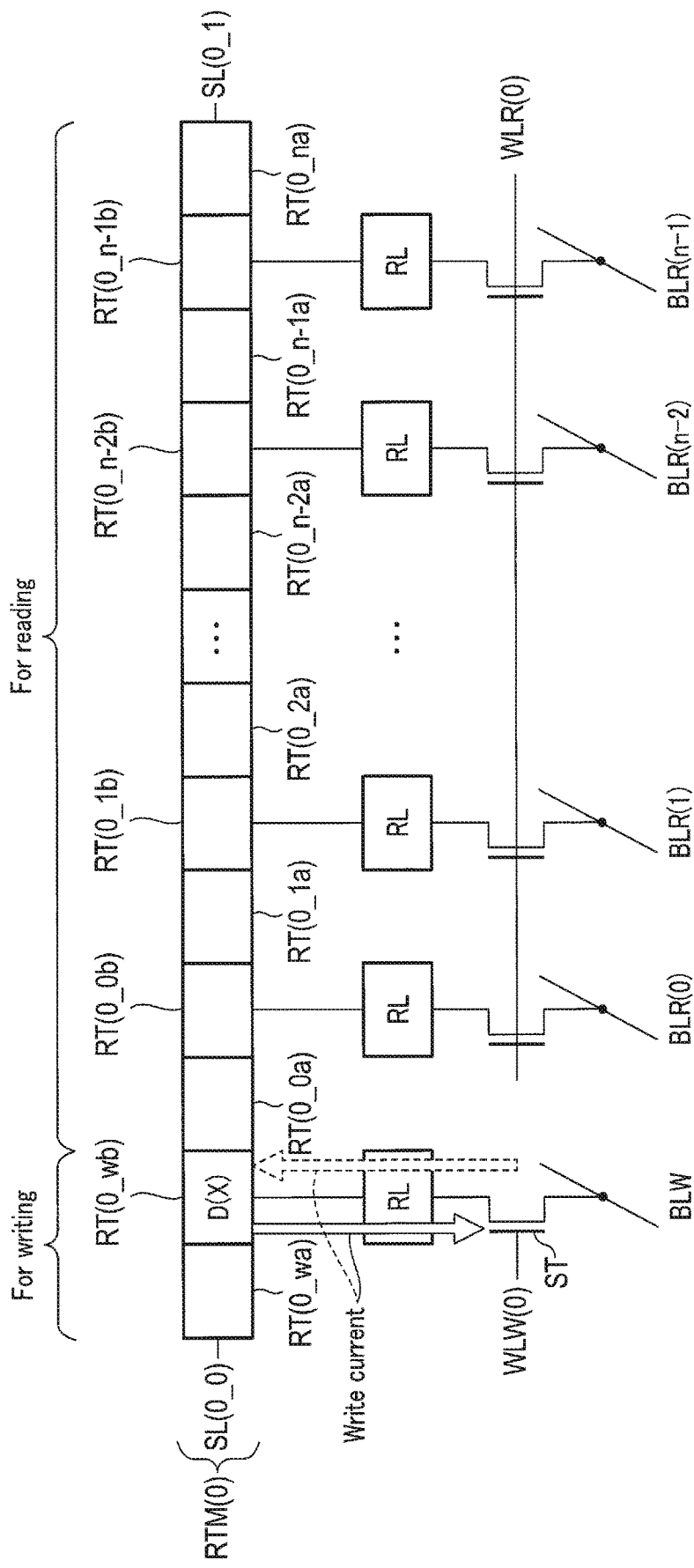
FIG. 11 is a block diagram showing a write operation example of the semiconductor memory device according to the embodiment.

As shown in FIG. 11, the controller 122 raises the potential of the write word line WLW(0) corresponding to the domain wall memory RTM(0) by using the first word line driver 103. Accordingly, the select transistor ST of the write memory cell MCW of the domain wall memory RTM(0) is turned on. Then, the controller 122 passes a write current through the reference layer RL and magnetic domain RT(0_wb) of the write memory cell MCW via the write bit line BLW by using the write driver 102. Alternatively, the controller 122 passes a write current through the magnetic domain RT(0_wb) and reference layer RL of the write memory cell MCW via the source line SL(00) close to the write memory cell MCW by using the shift driver 105. Data D(X) is thereby written in magnetic domain RT(0_wb). The direction of the current that flows through the write memory cell MCW is determined based on the objective data to be written. In the present embodiment, when objective data is written, determination data for determining objective data also needs to be written. Therefore, after the operation shown in FIG. 11, the following operation is performed.

Figure 12:
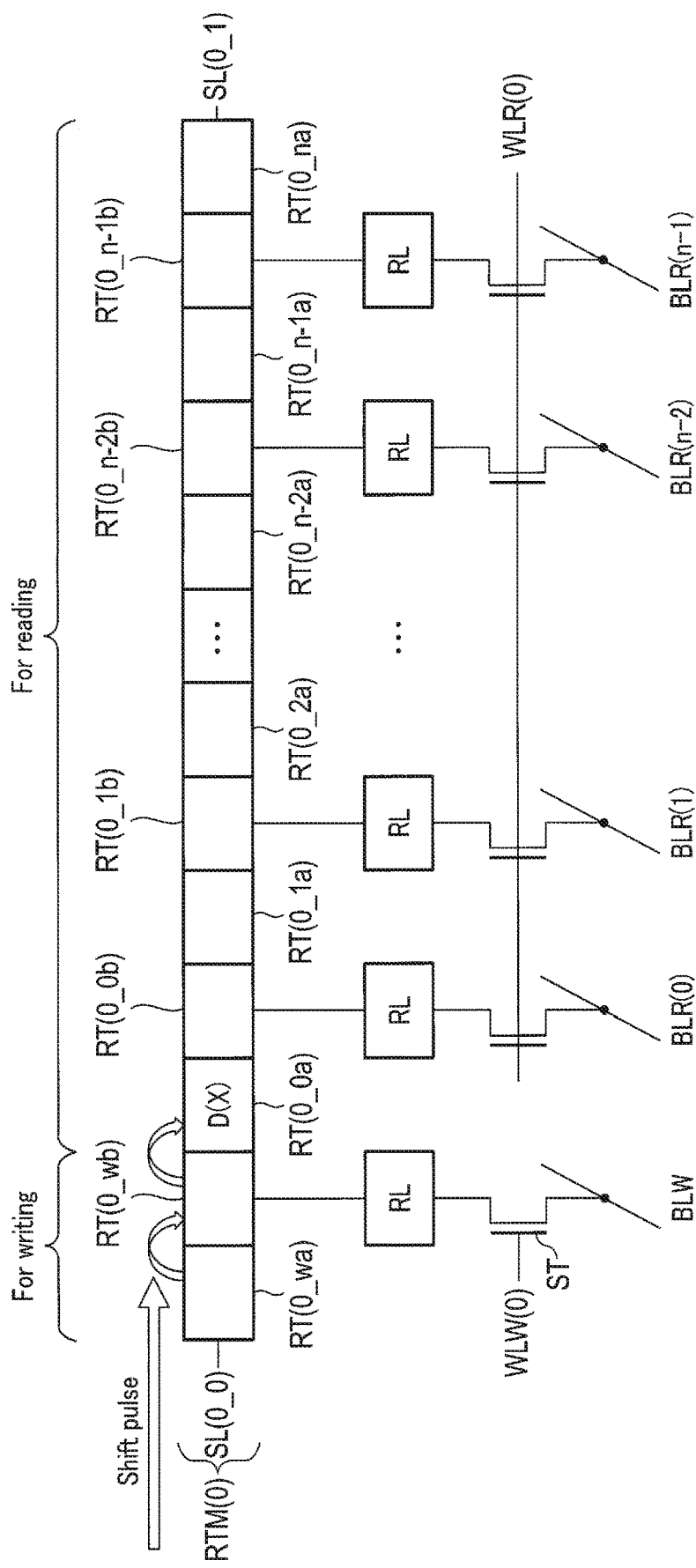
FIG. 12 is a block diagram showing the write operation example of the semiconductor memory device according to the embodiment.

As shown in FIG. 12, the controller 122 applies a shift pulse to magnetic domain RT(0_wa), which is an end of the domain wall memory RTM, via the source line SL(0_0) close to the write memory cell MCW by using the shift driver 105. Data stored in each magnetic domain RT is thereby shifted by one magnetic domain RT toward magnetic domain. RT (0_na), which is the other end of the domain wall memory RTM. Specifically, data D(X) stored in magnetic domain RT(0_wb) is shifted to magnetic domain RT(0_0a), which is adjacent to magnetic domain. RT(0_wb).

Next, as shown in FIG. 13, the controller 122 raises the potential of the write word line WLW(0) corresponding to the domain wall memory RTM(0) by using the first word line driver 103. Accordingly, the select transistor ST of the write memory cell MCW of the domain wall memory RTM(0) is turned on. Then, the controller 122 passes a write current through the reference layer RL and magnetic domain RT(0_wb) of the write memory cell MCW via the write bit line BLW by using the write driver 102. Data D(Y)=0 is thereby written in magnetic domain RT(0_wb). This data D(Y) is determination data used when data D(X) is read, as will be described later.

Figure 14:
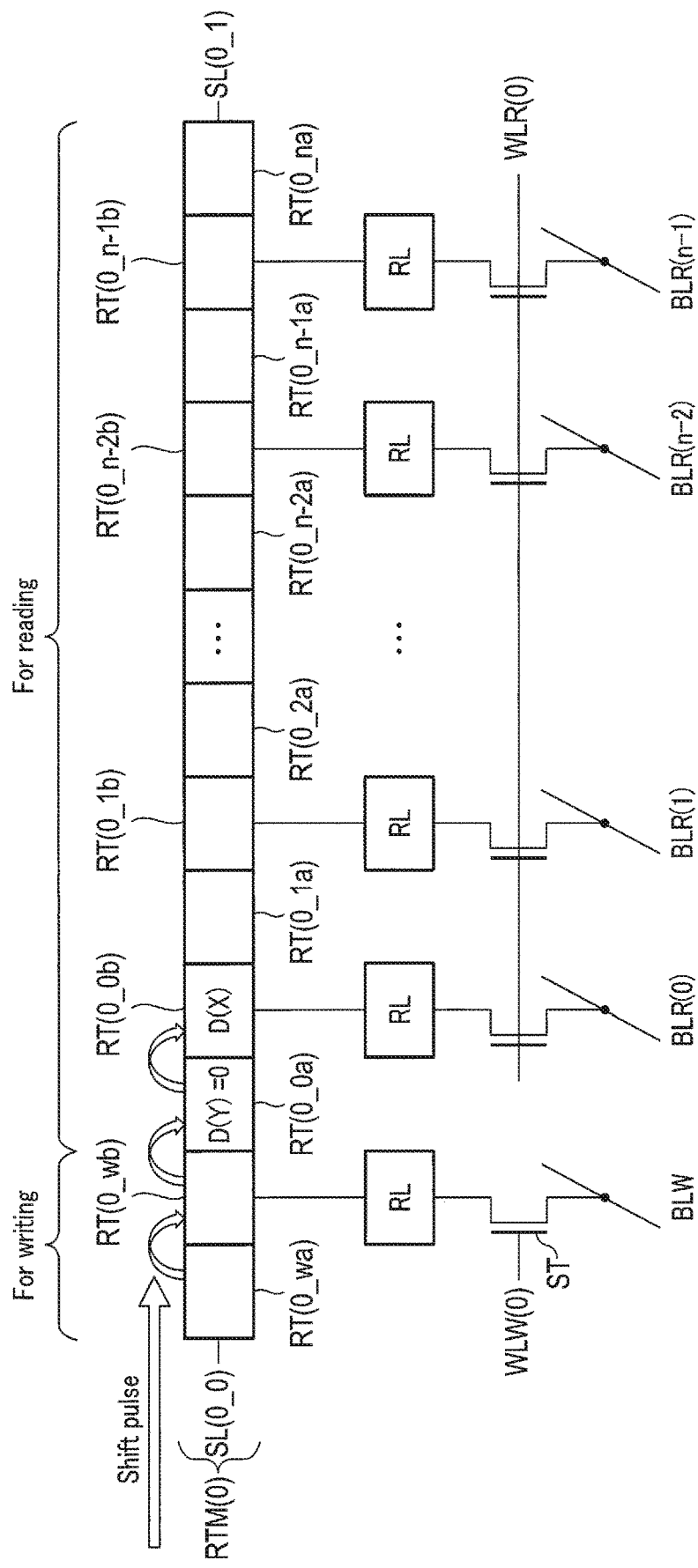
FIG. 14 is a block diagram showing the write operation example of the semiconductor memory device according to the embodiment.

Next, as shown in FIG. 14, the controller 122 applies a shift pulse to magnetic domain RT(0_wa), which is an end of the domain wall memory RTM, via the source line SL(0_0) close to the write memory cell MCW by using the shift driver 105. Data stored in each magnetic domain RT is thereby shifted by one magnetic domain RT toward magnetic domain RT (0_na), which is the other end of the domain wall memory RTM. Specifically, data D(X) stored in magnetic domain RT(0_0a) is shifted to magnetic domain RT(0_0b), which is adjacent to magnetic domain RT(0_0a). Data D(Y) stored in magnetic domain RT(0_wb) is also shifted to magnetic domain RT(0_0a), which is adjacent to magnetic domain RT(0_wb).

As described above, the semiconductor memory device 10 performs a write operation so that one data item can be read by using two magnetic domains.

Next, a read operation of the semiconductor memory device according to the embodiment will be described.

<1-2-2> Overview of Read Operation

<1-2-2-1> Overview

Figure 15:
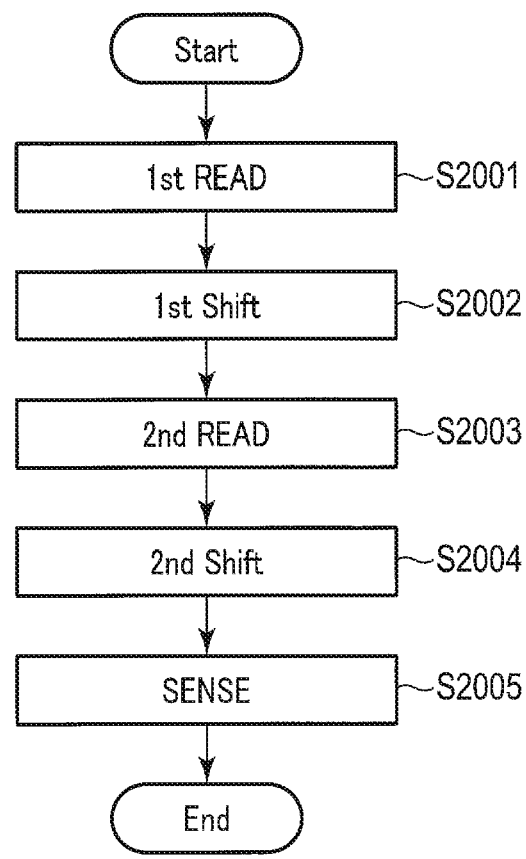
FIG. 15 is a flowchart showing a read operation of the semiconductor memory device according to the embodiment.

The overview of the read operation of the semiconductor memory device according to the embodiment will be described with reference to FIG. 15.

[Step S2001]

First, the controller 122 performs a first read operation (1st READ) on a memory cell MCR storing objective data.

Specifically, upon receipt of a read instruction (host command) from the host 2, the memory controller 20 issues an active command and a read command to the semiconductor memory device 10.

Upon receipt of the active command and the read command from the memory controller 20, the semiconductor memory device 10 performs a first read operation on a read target memory cell MCR storing objective data. Before the first read operation is performed, data stored in the domain wall memory RTM needs to be shifted to an appropriate position, i.e., a magnetic domain RT corresponding to the read memory cell MCR.

More specifically, the semiconductor memory device 10 applies an H-level voltage to the read word line WLR coupled to the select transistor ST of the read target memory cell MCR storing objective data. Then, the semiconductor memory device 10 supplies a current to the memory cell MCR via the read bit line RLR or a source line SL. In this way, the semiconductor memory device 10 performs a first read operation (1st READ) on the selected memory cell MC. By this first read operation, the sense amplifier 101 stores the resistance state of the read target memory cell MC as voltage information (signal voltage) V1st.

[Step S2002]

Subsequently, data is shifted to read a current concerning determination data in a second read operation (2nd READ) to be described later.

Specifically, the semiconductor memory device 10 applies a pulse to the end of the domain wall memory RTM close to the write memory cell via the source line SL. Data of the domain wall memory RTM is thereby shifted by one magnetic domain.

[Step S2003]

Subsequently, the controller 122 performs a second read operation on a memory cell MCR storing determination data.

Specifically, the semiconductor memory device 10 applies an H-level voltage to the read word line WLR coupled to the select transistor ST of the read target memory cell MCR. Then, the semiconductor memory device 10 supplies a current to the memory cell MCR via the read bit line BLR or a source line SL. In this way, the semiconductor memory device 10 performs a second read operation on the selected memory cell MC. By this second read operation, the sense amplifier 101 stores the resistance state of the read target memory cell MC as voltage information (signal voltage) V2nd. This V2nd is voltage information for determining V1st.

[Step S2004]

Subsequently, the controller 122 controls the shift driver 105 to shift the position of objective data to the magnetic domain RT corresponding to the read memory cell MCR.

Specifically, the semiconductor memory device 10 applies a pulse to the end of the domain wall memory RTM far from the write memory cell MCW via the source line SL. Data of the domain wall memory RTM is thereby shifted by one magnetic domain. Accordingly, data shifted by step S2002 returns to its original position. Consequently, data becomes non-destructive.

[Step S2005]

The sense amplifier 101 determines the result of V1st generated by step S2001 based on V2nd generated by step S2003. Specifically, the sense amplifier 101 compares, for example, current I2nd based on V2nd with a current obtained by adding reference current Ishift1 to current I1st based on V1st to determine data stored in the memory cell MC. Another method may be used to determine the result of V1st.

<1-2-2-2> Specific Example

A specific example of the read operation of the semiconductor memory device according to the embodiment will be described with reference to FIGS. 16 to 20. As an example, the case where data is read from domain wall memory RTM(0) will be described.

Figure 16:
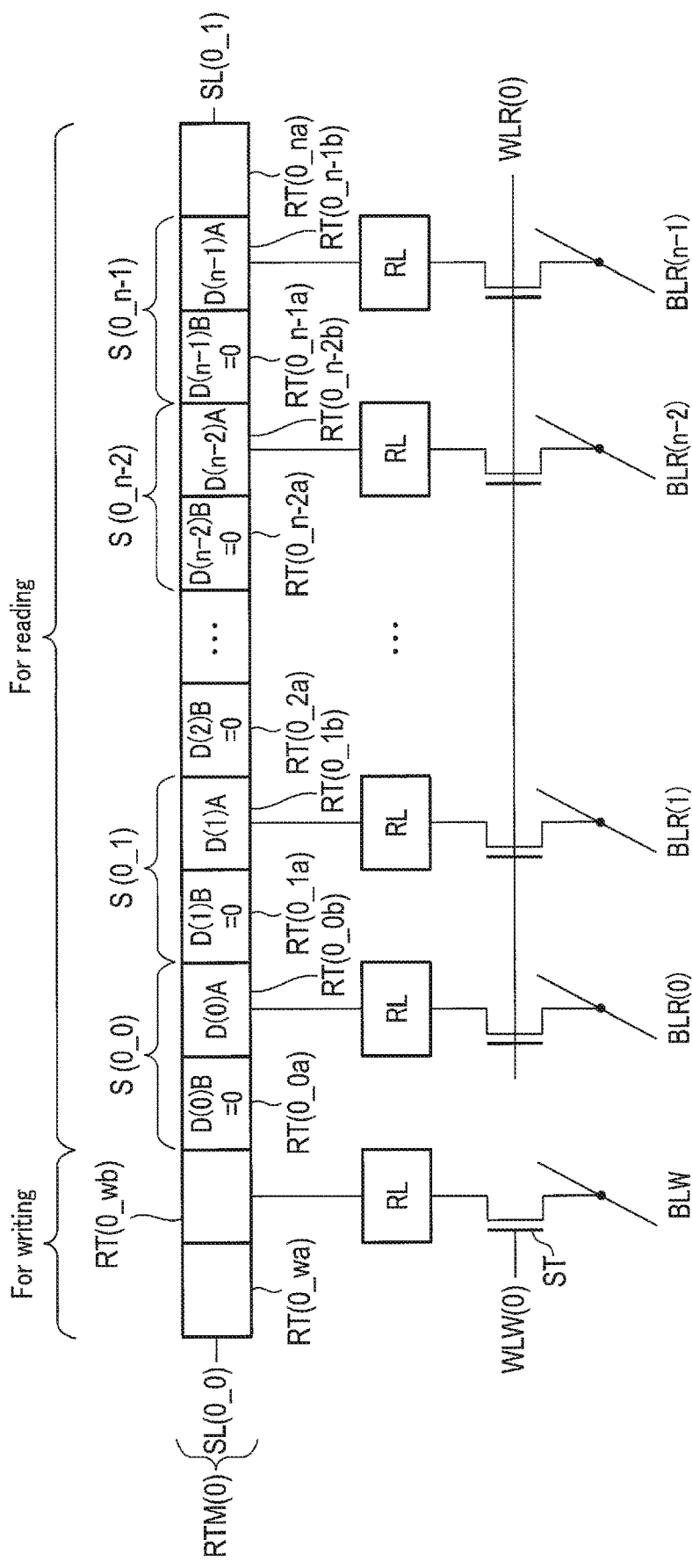
FIG. 16 is a block diagram showing, a read operation example of the semiconductor memory device according to the embodiment.

Data stored in each magnetic domain will be described with reference to FIG. 16. As shown in FIG. 16, data to be read is stored in the magnetic domain RT of a read memory cell MCR. Then, determination data is stored in the adjacent magnetic domain. RT on the magnetic domain RT (0_wa) side of the magnetic domain RT of the read memory cell MCR.

Specifically, data D(0)A to be read is stored in magnetic domain RT(0_0b) of a read memory cell MCR. Determination data D(0)B is stored in the magnetic domain RT(0_0a) adjacent to magnetic domain RT(0_0b) on the magnetic domain RT (0_wa) side. In this example, data D(0)B is data "0". In this way, magnetic domain RT(0_0b) and magnetic domain RT(0_0a) are used as one magnetic domain set S(0_0).

Data D(1)A to be read is stored in magnetic domain RT(0_1b) of a read memory cell MCR. Determination data D(1)B is stored in the magnetic domain RT(01a) adjacent to magnetic domain RT(0_1b) on the magnetic domain RT (0_wa) side. In this example, data D(1)B is data "0". In this way, magnetic domain RT(0_1b) and magnetic domain RT(0_1a) are used as one magnetic domain set S(0_1).

The same as the above-described sets S(0_0) and S(0_1) applies to sets S(0_2) to S(0_n−1).

As shown in FIG. 17, the controller 122 raises the potential of the read word line WLR(0) corresponding to the domain wall memory RTM(0) by using the second word line driver 104. Accordingly, the select transistors ST of the read memory cells MCR of the domain wall memory RTM(0) are turned on. Then, the controller 122 passes a read current through the reference layers RL and magnetic domains RT(0_0b), (0_1b) . . . (0_n−2b) and (0_n−1b) of the read memory cells MCR via the read bit lines BLR by using the sense amplifier 101. Accordingly, the sense amplifier 101 generates, from read bit line BLR(0), V1st concerning the current that has flown through the reference layer RL and magnetic domain RT(0_0b). Similarly, the sense amplifier 101 generates Mist concerning each of the currents that have flown through the reference layers RL and magnetic domains RT(0_1b), . . . , (0n–2b), and (0_n–1b).

Next, as shown in FIG. 18, the controller 122 applies a shift pulse to magnetic domain RT(0_wa), which is an end of the domain wall memory RTM, via the source line SL(0_0) close to the write memory cell MCW by using the shift driver 105. Data stored in each magnetic domain RT is thereby shifted by one magnetic domain RT toward magnetic domain RT (0_na), which is the other end of the domain wall memory RTM. Specifically, data D(n–1) A stored in magnetic domain RT(0_n–1b) is shifted to magnetic domain RT(0_na), which is adjacent to magnetic domain RT(0_n–1b). Similarly, data D(n–1)B stored in magnetic domain RT(0_n–1a) is shifted to magnetic domain RT(0n–1b), which is adjacent to magnetic domain RT(0n–1a). Similarly, data stored in each magnetic domain RT is shifted toward magnetic domain RT (0_na). Preparation for reading reference voltage information to read data items D(1)A to D(n–1)A is thereby completed.

As shown in FIG. 19, the controller 122 raises the potential of the read word line WLR(0) corresponding to the domain wall memory RTM(0) by using the second word line driver 104. Accordingly, the select transistors ST of the read memory cells MCR of the domain wall memory RTM(0) are turned on. Then, the controller 122 passes a read current through the reference layers RL and magnetic domains RT(0_0b), (0_1b) . . . (0_n–2b) and (0_n–1b) of the read memory cells MCR via the read bit lines BLR by using the sense amplifier 101. Accordingly, the sense amplifier 101 generates, from read bit line BLR(0), V2nd concerning the current that has flown through the reference layer RL and magnetic domain RT(0_0b). Similarly, the sense amplifier 101 generates V2nd concerning each of the currents that have flown through the reference layers RL and magnetic domains RT(0_1b), . . . , (0n–2b), and (0n–1b).

Next, as shown in FIG. 20, the controller 122 applies a shift pulse to magnetic domain RT(0_na), which is an end of the domain wall memory RTM, via the source line SL(0_1) far from the write memory cell by using the shift driver 105. Data stored in each magnetic domain RT is thereby shifted by one magnetic domain RT toward magnetic domain RT (0_wa), which is the other end of the domain wall memory RTM. Specifically, data D(0)B stored in magnetic domain RT(0_0b) is shifted to magnetic domain RT(0_0a), which is adjacent to magnetic domain RT(0_0b) Similarly, data D(0)A stored in magnetic domain RT(0_1a) is shifted to magnetic domain RT(0_0b), which is adjacent to magnetic domain RT(0_1a). Similarly, data stored in each magnetic domain RT is shifted toward magnetic domain RT (0_wa). Accordingly, data items return to the respective positions described with reference to FIG. 16. Consequently, data returns to the original position without being destroyed. This is because there is a magnetic domain RT (0_na) as a redundant area at an end of the domain wall memory RTM. Objective data stored in magnetic domain RT (0_n–1b) can be thereby saved in the redundant area in the shift operation performed before the second read operation, thereby preventing data from being destroyed.

<1-3> Effect

According to the above-described embodiment, the semiconductor memory device includes a domain wall memory (memory layer) extending in the word line direction, and a plurality of memory cells sharing the domain wall memory. Data to be read is stored in a magnetic domain (part of the domain wall memory) for data reading, and reference data for reading the data to be read is stored in the adjacent magnetic domain. When reading data, the semiconductor memory device passes a read current through a read target memory cell (including a magnetic domain), and generates voltage information V1st. Then, the semiconductor memory device applies a pulse for shifting data by one magnetic domain to one end of the domain wall memory. Reference data is thereby shifted to a magnetic domain of a read memory cell. By reading data, the semiconductor memory device generates voltage information V2nd concerning the reference data. After that, the semiconductor memory device applies a pulse for shifting data by one magnetic domain to the other end of the domain wall memory. The other end of the domain wall memory is an end different from the end to which a shift pulse is applied to shift reference data to the magnetic domain of the read memory cell.

The semiconductor memory device according to the above-described embodiment reads data in this manner. This method enables performing a self-reference reading method without destroying data stored in a memory cell (magnetic domain). It is also unnecessary to write back data. Shifting data stored in each magnetic domain requires 1 ns or so, and is performed at high speed.

The memory cells of the semiconductor memory device according to the embodiment are classified as a write memory cell and a read memory cell. Therefore, a write operation and a read operation can be simultaneously performed.

Specifically, as shown in FIG. 21, it is possible to perform a write operation on domain wall memory RTM(0) and perform a read operation on domain wall memory RTM(1).

More specifically, upon receipt of a write operation command for word line WL(0) and a read operation command for word line WL(1), the controller 122 brings write word line WLW(0) to the H level by using the first word line driver 103, and brings read word line WLR(1) to the H level by using the second word line driver 104. Accordingly, a write operation is performed at the write memory cell MCW relating to domain wall memory RTM(0), and a read operation is performed at the read memory cell MCW relating to domain wall memory RTM(1). In other words, the semiconductor memory device according to the embodiment can simultaneously perform a read operation at the first word address and a write operation at the second row address.

<2> Modifications, Etc

According to the above-described embodiment, voltage information V1st is generated in the first read operation, and voltage information V2nd is generated in the second read operation, thereby performing a self-reference reading method. However, a self-reference reading method may be performed by generating current information I1st in the first read operation and generating current information I2nd in the second read operation.

In the above embodiment, the case where data "0" is used as determination data is described. However, inverted data of objective data may also be used as determination data. In that case, as shown in FIG. 22, a magnetic domain adjacent to the magnetic domain storing objective data stores inverted data of objective data. Specifically, when objective data D(0)A is stored in magnetic domain RT(0_0b), inverted data BD(0)A of data. D(0)A is stored in magnetic domain RT(0_0a) as determination data D(0)B. Similarly, objective data and determination data obtained by inverting objective data may be stored in the other magnetic domains.

In the above embodiment, the case where a current is passed from the sense amplifier 101 to the shift driver 105 in the first read operation and the second read operation is described.

However, as shown in FIGS. 23 and 24, the first read operation and the second read operation may be performed by passing a current from the shift driver 105 to the sense amplifier 101.

Figure 25:
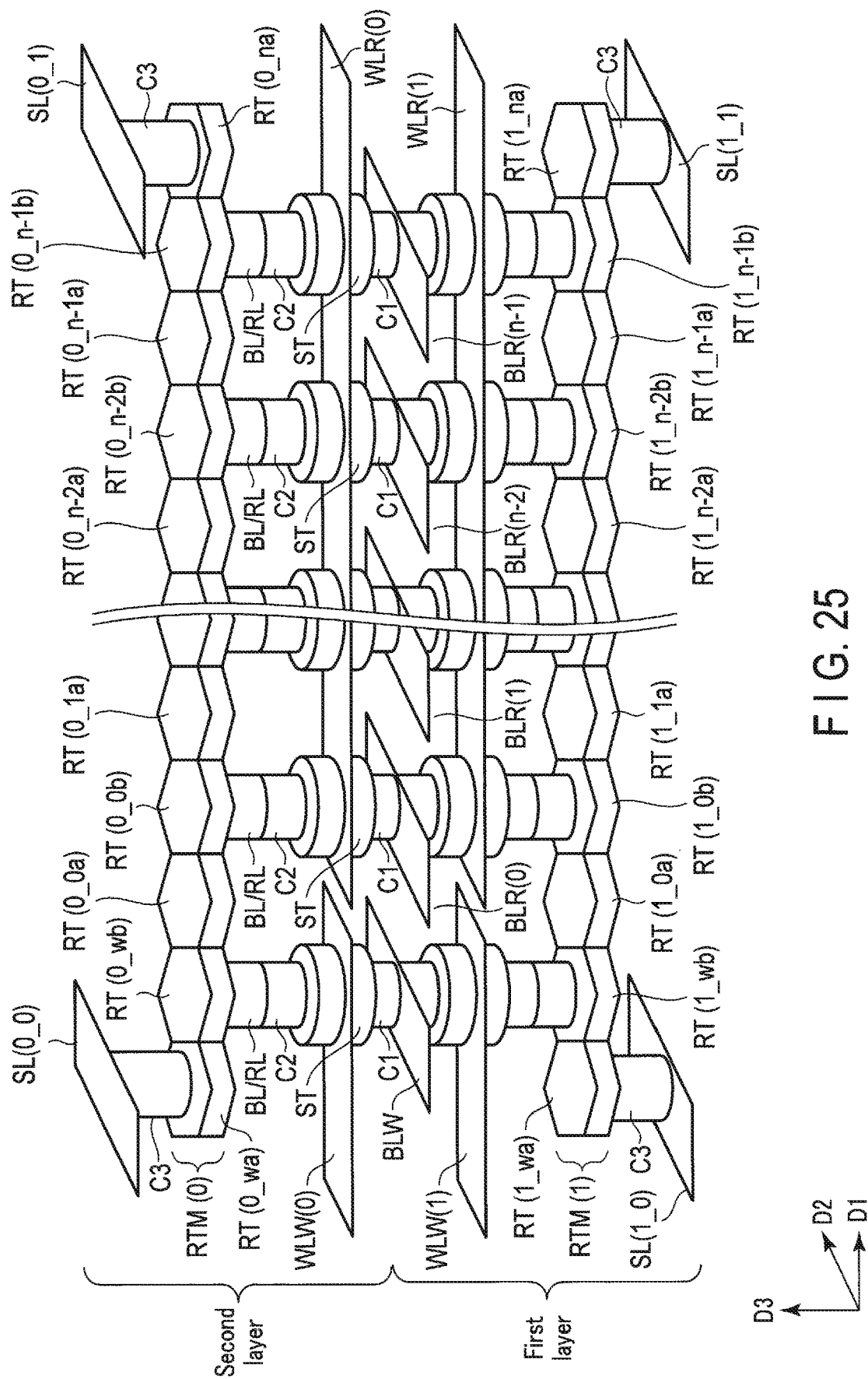
FIG. 25 is a perspective view showing a row-direction configuration of a memory cell array of a semiconductor memory device according to a modification of the embodiment.

The structure of the memory cell array 100 is not limited to the one shown in FIG. 5, and may be a double-layered structure as shown in FIG. 25. For example, it is possible to provide a memory cell group relating to domain wall memory RTM(1) in the first layer, and provide a memory cell group relating to domain wall memory RTM(0) above the first layer. In this case, each bit line can be shared.

In the above-described embodiment, a shift operation, read operation, and write operation of data of the domain wall memory RTM are performed by using the shift driver 105. However, it is also possible to perform a read operation and write operation with another driver, and perform only a shift operation with the shift driver 105.

In the above-described embodiment, a shift operation, read operation, and write operation are performed via a source line SL. However, a dedicated interconnect for each of a shift operation, read operation, and write operation may be provided at an end of the domain wall memory RTM.

In the above embodiment, a source line SL is provided at the ends of the domain wall memory RTM; however, any number of source lines SL may be provided.

In the above embodiment, the memory system or semiconductor memory device may be a package.

The term "couple" in the above-described embodiment includes indirect coupling via a transistor, a resistor or the like.

Herein, an MEAN that stores data using a magnetoresistive effect element (a magnetic tunnel junction (MTJ) element) as a resistance change element is explained as an example; however, the memory device is not limited thereto.

For example, the embodiment may be applicable to a resistance change type memory similar to the MRAM, for example, a semiconductor memory device including an element that stores data using a resistance change, such as ReRAM or PCRAM.

In addition, the embodiment may be applicable to a semiconductor memory device including an element that can read data stored by a resistance change caused by application of a current or voltage, or stored by converting the resistance difference involved with the resistance change into a current difference or a voltage difference, regardless of whether the semiconductor memory device is a volatile memory or a nonvolatile memory.

An embodiment of the present invention has been described above; however, the present invention is not limited to the above-described embodiment, and can be variously modified in practice without departing from the spirit of the invention. Furthermore, the above-described embodiment includes inventions at various stages, and various inventions may be extracted by appropriately combining the disclosed structural elements. For example, even if some structural elements are deleted from the disclosed structural elements, the resultant structure can be extracted as an invention as long as a predetermined effect can be obtained.

The invention claimed is:

1. A semiconductor memory device comprising:
   a first memory layer including a plurality of memory units electrically coupled to one another;
   a first memory area including a first memory unit for data writing of the memory units;
   a second memory area including second memory units for data reading of the memory units; and
   a controller configured to write data in the first memory unit, shift the data written in the first memory unit to the second memory units, and read the data shifted to the second memory units.

2. The semiconductor memory device according to claim 1, wherein:
   when writing first data in the first memory unit, the controller:
   writes the first data in the first memory unit,
   shifts the first data to a third memory unit adjacent to the first memory unit, and
   writes second data for determining the first data in the first memory unit.

3. The semiconductor memory device according to claim 1, wherein:
   when reading first data stored in one of the second memory units, the controller:
   obtains first information concerning the first data stored in the one of the second memory units,
   shifts second data for determining the first data and stored in a third memory unit adjacent to the one of the second memory units to the one of the second memory units, and shifts the first data to a fourth memory unit adjacent to the one of the second memory units,
   obtains second information concerning the second data shifted to the one of the second memory units,
   shifts the second data shifted to the one of the second memory units to the third memory unit, and shifts the first data shifted to the fourth memory unit to the one of the second memory units, and
   determines the first data based on the first information and the second information.

4. The semiconductor memory device according to claim 3, wherein each of the first information and the second information is a voltage or a current.

5. The semiconductor memory device according to claim 2, wherein the second data is inverted data of the first data.

6. The semiconductor memory device according to claim 3, wherein the second data is inverted data of the first data.

7. The semiconductor memory device according to claim 4, wherein the second data is inverted data of the first data.

8. The semiconductor memory device according to claim 1, further comprising:
   a second memory layer including a plurality of memory units electrically coupled to one another, wherein
   when receiving a read command for the first memory layer, and receiving a write command for the second memory layer, the controller simultaneously performs a read operation on the first memory layer and a write operation on the second memory layer.

9. The semiconductor memory device according to claim 2, further comprising:
   a second memory layer including a plurality of memory units electrically coupled to one another, wherein
   when receiving a read command for the first memory layer, and receiving a write command for the second memory layer, the controller simultaneously performs a read operation on the first memory layer and a write operation on the second memory layer.

10. The semiconductor memory device according to claim 3, further comprising:
a second memory layer including a plurality of memory units electrically coupled to one another, wherein
when receiving a read command for the first memory layer, and receiving a write command for the second memory layer, the controller simultaneously performs a read operation on the first memory layer and a write operation on the second memory layer.

11. The semiconductor memory device according to claim 4, further comprising:
a second memory layer including a plurality of memory units electrically coupled to one another, wherein
when receiving a read command for the first memory layer, and receiving a write command for the second memory layer, the controller simultaneously performs a read operation on the first memory layer and a write operation on the second memory layer.

12. The semiconductor memory device according to claim 5, further comprising:
a second memory layer including a plurality of memory units electrically coupled to one another, wherein
when receiving a read command for the first memory layer, and receiving a write command for the second memory layer, the controller simultaneously performs a read operation on the first memory layer and a write operation on the second memory layer.

13. The semiconductor memory device according to claim 1, wherein the first memory area includes:
a first magnetoresistive effect element including the first memory unit and a first reference layer; and
a first select transistor.

14. The semiconductor memory device according to claim 13, wherein the first select transistor in the first memory area includes one end coupled to one end of the first magnetoresistive effect element, and another end coupled to a first bit line.

15. The semiconductor memory device according to claim 14, wherein the first bit line coupled to the first memory area is not coupled to a sense amplifier for reading data.

16. The semiconductor memory device according to claim 1, wherein:
the second memory area includes:
second magnetoresistive effect elements each including one of the second memory units and a second reference layer; and
second select transistors.

17. The semiconductor memory device according to claim 16, wherein each second select transistor in the second memory area includes one end coupled to one end of a corresponding one of the second magnetoresistive effect elements, and another end coupled to a second bit line.

18. The semiconductor memory device according to claim 17, wherein the second bit line coupled to the second memory area is coupled to a sense amplifier for reading data.

19. The semiconductor memory device according to claim 1, wherein:
the first memory area includes:
a first magnetoresistive effect element including the first memory unit and a first reference layer; and
a first select transistor, and
the second memory area includes:
second magnetoresistive effect elements each including one of the second memory units and a second reference layer; and
second select transistors.

20. The semiconductor memory device according to claim 19, wherein a first word line coupled to a gate of the first select transistor differs from a second word line coupled to gates of the second select transistors.

* * * * *